(12) United States Patent
Montana et al.

(10) Patent No.: US 11,675,939 B2
(45) Date of Patent: Jun. 13, 2023

(54) POLYLINE CONTRIBUTOR IN CIVIL ENGINEERING

(71) Applicant: DASSAULT SYSTEMES, Velizy Villacoublay (FR)

(72) Inventors: Nicolas Montana, Aix-en-Provence (FR); Andre Lieutier, Aix-en-Provence (FR); Marc Monteil, Aix-en-Provence (FR)

(73) Assignee: DASSAULT SYSTEMES, Velizy Villacoublay (FR)

(*) Notice: Subject to any disclaimer, the term of this patent is extended or adjusted under 35 U.S.C. 154(b) by 154 days.

(21) Appl. No.: 17/107,434

(22) Filed: Nov. 30, 2020

(65) Prior Publication Data
US 2021/0165935 A1    Jun. 3, 2021

(30) Foreign Application Priority Data
Nov. 28, 2019 (EP) .................................... 19306533

(51) Int. Cl.
*G06F 30/23* (2020.01)
*G06T 7/10* (2017.01)
(Continued)

(52) U.S. Cl.
CPC .............. *G06F 30/23* (2020.01); *G06F 30/13* (2020.01); *G06T 7/10* (2017.01); *G06T 17/205* (2013.01); *G06T 2207/20152* (2013.01)

(58) Field of Classification Search
CPC . G06F 30/23; G06F 30/13; G06T 7/10; G06T 17/205; G06T 2207/20152; G06T 7/155; G06T 7/11; G06T 17/10
(Continued)

(56) References Cited

U.S. PATENT DOCUMENTS

| 8,004,517 B1* | 8/2011 | Edelsbrunner .......... G06T 17/20 345/611 |
| 8,842,115 B2* | 9/2014 | Praun ...................... G06T 17/05 345/419 |

(Continued)

FOREIGN PATENT DOCUMENTS

| CN | 107958183 A | 4/2018 | |
| EP | 3828824 A1 * | 6/2021 | ............. G06F 30/13 |

OTHER PUBLICATIONS

Autodesk Support. "How to create a 3D polyline with elevations from points in Civil 3D" Civil 3D Support and learning, Autodesk, Apr. 16, 2019, https://knowledge.autodesk.com/support/civil-3d/troubleshooting/caas/sfdcarticles/sfdcarticles/How-to-create-a-3D-polyline-with-elevations-from-points.html (Year: 2019).*

(Continued)

*Primary Examiner* — Iftekhar A Khan
(74) *Attorney, Agent, or Firm* — Oblon, McClelland, Maier & Neustadt, L.L.P.

(57) ABSTRACT

A computer-implemented method for civil engineering including obtaining a mesh representing a terrain and a polyline on the mesh, the method further includes computing a contributor of the polyline. The computing of the contributor includes modifying the mesh by determining, based on the polyline, a trench below the polyline. The computing of the contributor further includes computing a watershed segmentation of the terrain based on the modified mesh. The computing of the contributor further includes, based on the computed watershed segmentation, identifying, on the modified mesh, a basin comprising the trench. The contributor corresponds to the identified basin.

16 Claims, 9 Drawing Sheets

(51) Int. Cl.
  *G06F 30/13* (2020.01)
  *G06T 17/20* (2006.01)
(58) Field of Classification Search
  USPC .......................................................... 703/1
  See application file for complete search history.

(56) References Cited

U.S. PATENT DOCUMENTS

| | | | | |
|---|---|---|---|---|
| 2003/0068074 | A1* | 4/2003 | Hahn | G06T 7/155 |
| | | | | 382/128 |
| 2006/0007232 | A1* | 1/2006 | Layne | G06T 11/203 |
| | | | | 345/441 |
| 2007/0024624 | A1* | 2/2007 | Poppen | G06T 9/20 |
| | | | | 345/441 |
| 2011/0262559 | A1* | 10/2011 | Luster-Teasley | B09C 1/002 |
| | | | | 524/413 |
| 2014/0204082 | A1* | 7/2014 | Vesely | G06T 15/10 |
| | | | | 345/420 |
| 2016/0196645 | A1* | 7/2016 | Oh | G06F 30/23 |
| | | | | 382/131 |
| 2019/0197691 | A1* | 6/2019 | Chen | G06T 7/149 |
| 2020/0110960 | A1* | 4/2020 | Andilla | G06V 10/48 |
| 2021/0096276 | A1* | 4/2021 | Annavarapu Srinivas | ................... |
| | | | | G06F 30/23 |
| 2022/0398807 | A1* | 12/2022 | Sun | G06T 15/04 |

OTHER PUBLICATIONS

Autodesk Help. "To Add a Feature Line to a Surface as a Breakline" Civil 3D Support and learning, Autodesk, Nov. 12, 2018, https://knowledge.autodesk.com/support/civil-3d/learn-explore/caas/CloudHelp/cloudhelp/2016/ENU/Civil3D-UserGuide/files/GUID-8811E11E-9CE5-43D4-9957-F4C23D6805B5-htm.html (Year: 2018).*
Autodesk Help. "To Calculate Surface Catchment Areas" Civil 3D Support and learning, Autodesk, Nov. 12, 2018, https://knowledge.autodesk.com/support/civil-3d/learn-explore/caas/CloudHelp/cloudhelp/2016/ENU/Civil3D-UserGuide/files/GUID-AD64F937-F378-44B7-9EFE-2F1220325BEO-htm.html (Year: 2018).*
Kihara, Ian. "Road Design Workflow With Autocad Civil 3D" Civil 3D Support and learning, Autodesk, Nov. 9, 2018, https://knowledge.autodesk.com/support/civil-3d/learn-explore/caas/simplecontent/content/road-design-workflow-autocad-civil-3d.html (Year: 2018).*
Zlatislav. "How to Automatically Set Elevations to Polyline in AutoCAD" Skill Amplifier, Jan. 30, 2018, https://skillamplifier.com/automatically-assign-elevations/ (Year: 2018).*
Hailey, Brian. "Contour Smoothing vs. Surface Smoothing" Civil 3D Plus Taking Civil 3D to the next level. Apr. 22, 2013. https://civil3dplus.wordpress.com/2013/04/22/contour-smoothing-vs-surface-smoothing/ (Year: 2013).*
Pulla et al. ("Improved Curvature Estimation for Watershed Segmentation of 3-Dimensional Meshes", 2001, pp. 1-15) (Year: 2001).*
Page et al. ("Perception-based 3D Triangle Mesh Segmentation Using Fast Marching Watersheds", IEEE, 2003, pp. 1-6) (Year: 2003).*
Mangan et al. ("Partitioning 3D Surface Meshes Using Watershed Segmentation", IEEE, 1999, pp. 308-321) (Year: 1999).*
Bleau et al. ("Watershed-Based Segmentation and Region Merging", Computer Vision and Image Understanding 77, 317-370 (2000) ) (Year: 2000).*
Emanuele Danovaro, et al.; "Morphology-Driven Simplification and Muitiresolution Modeling of Terrains"; GIS'03; Nov. 7-8, 2003; New Orleans, Louisiana, USA; 8 pages.
Dominique Attali, et al.; "Persistence-Sensitive Simplification of Functions on Surfaces in Linear Time"; Hal Archives-Ouvertes.FR; HAL id: hal-02293165; https://hal.inra.fr/hal-022931 65; Submitted on Sep. 20. 2019; 15 pages.
Extended Search Report dated Mar. 30, 2020 in European Patent Application No. 19306532.3-1210; 8 pages.

Hiep-Thuan DO, et al.; "Parallel Computing of Catchment Basins of Rivers in Large Digital Elevation Models"; High Performance Computing and Simulation (HPCS): 2010 International Conference on, IEEE, Piscataway, NJ, USA; Jun. 28, 2010; XP031731510: ISBN: 978-1-4244-6827-0; 9 pages.
Serge Beucher; "Watershed, Hierarchical Segmentation and Waterfall Algorithm; IN: "Computational Imaging and Vision; 1994; Springer Netherlands; NL; XP055277475; ISSN: 1381-6446; vol. 2; 11 pages.
Emanuele Danovaro, et al.; "Multiresolution Morse Triangulations"; Proceedings of The 14th ACM Symposium on Solid and Physical Modeling. SPM '10. ACM Press; New York, New York, USA; Sep. 2010; XP058343920; ISBN:978-1-60558-984-8; 6 pages.
Search Report dated Apr. 30, 2020 in Europe Patent Application No. 19306533.1-1210; 5 pages.
R. Weibel, et al.; "Digital Terrain Modelling"; Geographical Information Systems: Principles and Applications/Longman; [U.A.], Harlow, Essex [U.A]; Dec. 12, 1991; XP002685390; ISBN: 978-0-582-05661-9; 29 pages.
E. James, et al.; "Algorithm for Precise Drainage-Basin Delineation"; Journal of Hydraulic Engineering, American Society of Civil Engineers, New York, NY, USA; vol. 120, No. 3; Mar. 1, 1994; ISSN:0733-9429; 15 pages.
Hiep-Thuan DO, et al.; "Parallel Computing of Catchment Basins in Large Digital Elevation Model"; International Conference on Financial Cryptography and Data Security; [Lecture Notes in Computer Science; Lect. Notes Computer]; Springer, Berlin, Heidelberg; XP019138572; ISBN: 978-3-642-17318-9; 6 pages.
L. E. Band; "A Terrain-Based Watershed Information System"; Hydrological Processing; vol. 3, No. 2; Apr. 1989; XP055678078; ISSN: 0885-6087; 12 pages.
Peer-Timo Bremer, et al.; "A Topological Hierarchy for Functions on Triangulated Surfaces"; IEEE Transactions on Visualization and Computer Graphics; vol. 10, No. 4; Jul./Aug. 2004; 12 pages.
Emanuele Danovaro, et al.; "Morphology-Driven Simplification and Muitiresoiution Modeling of Terrains"; GIS'03; Nov. 7-8, 2003; New Orleans, Louisiana, USA; 8 pages.
Lidija Comic, et al.; "Morphological Modeling of Terrains and Volume Data"; Springer Briefs in Computer Science; 116 pages 2014.
A. Gyulassy, et al.; "Efficient Computation of Morse-Smale Complexes for Three-Dimensional Scalar Functions"; UCRL-CONF-235787; Oct. 24, 2007; Visualization 2007, Sacramento, CA, U.S.; Oct. 28-31, 2007; 10 pages.
Robin Forman; "Morse Theory for Cell Complexes"; Advances in Mathematics 134; Article No. AI971650; 1998; 56 pages.
Herbert Edelsbrunner, et al.; "Hierarchical Morse-Smale Complexes for Piecewise Linear 2-Manifolds"; Discrete & Computational Geometry 30:87-107 (2003); DOI:10.1007/s00454-003-2926-5; 21 pages.
Dmitry Kozlov; "Combinatorial Algebraic Topology"; Algorithms and Computation in Mathematics; vol. 21; Springer; 391 pages 2008.
Fernand Meyer; "Topographic Distance and Watershed Lines"; Signal Processing 38, 1994; 13 pages.
Yukio Matsumoto; "Translations of Mathematical Monographs vol. 208; An Introduction to Morse Theory"; Iwanami Series in Modern Mathematics; American Mathematical Society, Providence, Rhode Island; 1997; 236 pages.
Shigeo Takahashi, et al.; "Algorithms for Extracting Correct Critical Points and Constructing Topological Graphs from Discrete Geographical Elevation Data"; Eurographics '95/FRITS Post and Martin Gobel; 1995; vol. 14; No. 3; 12 pages.
Keith M. Wolhuter; "Geometric Design of Roads Handbook"; 2015; 601 pages.
Thomas Banchoff; "Critical Points and Curvature for Embedded Polyhedra"; J. Differential Geometry 1 (1967); 12 pages.
Dominique Attali, et al.; "Persistence-Sensitive Simplification of Functions on Surfaces in Linear Time"; Hal Archives-Ouvertes.Fr; Hal Id: hal-02293165: https://hal.inria.fr/hal-02293165; Submitted on Sep. 20, 2019; 15 pages.
Yang Fei et al.; " A Fast and Efficient Mesh Segmentation Method Based on Improved Region Growing"; Applied Mathematics—A

(56) References Cited

OTHER PUBLICATIONS

Journal of Chinese Universities, Editorial Committee of Applied Mathematics; A Jornal of Chinese Universities, Heidelberg; vol. 29, No. 4; Dec. 4, 2014; XP035411037; 13 pages.
Jun Wang, et al.; "Geometric Decomposition of 3D Surface Meshes Using Morse Theory and Region Growing"; The International Journal of Advanced Manufacturing Technology, Springer, Berlin, DE; vol. 56. No. 9-12, Mar. 19, 2011; XP019949381; ISSN: 1433-3015; 13 pages.
S. Berretti, et al.; "Partitioning of 3D Meshes Using Reeb Graphs"; International Conference on Pattern Recognition; Aug. 2006; XP055674549; ISSN:1051-4651; 4 pages.
Extended Search Report issued Mar. 27, 2020 in European Patent Application No. 193065315-1210; 10 pages.

\* cited by examiner

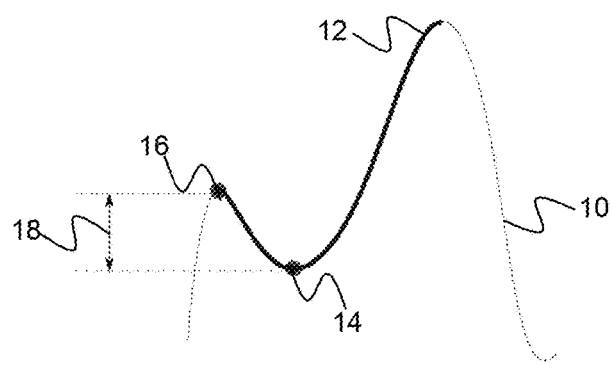
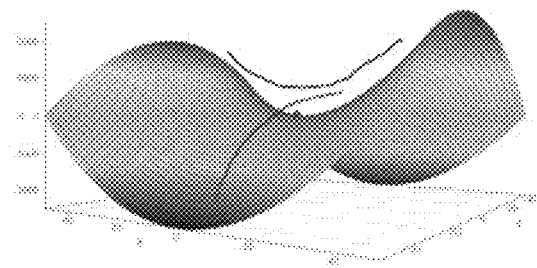
FIG. 1
FIG. 2
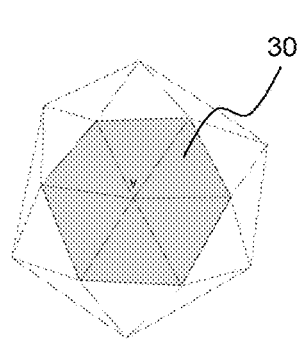
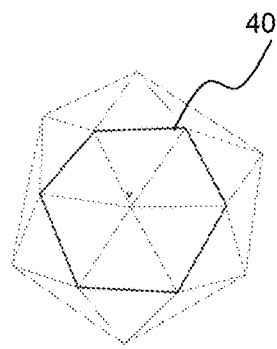
FIG. 3
FIG. 4

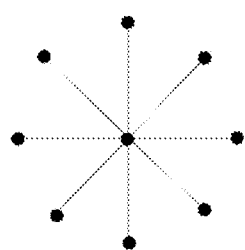
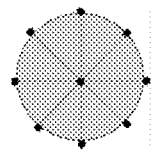
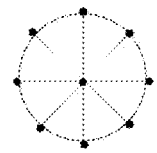
FIG. 5　　　　FIG. 6　　　　FIG. 7
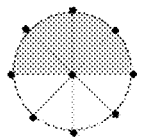
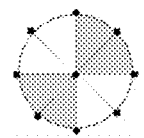
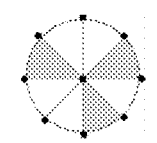
FIG. 8　　　　FIG. 9　　　　FIG. 10

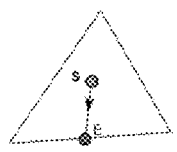
FIG. 11
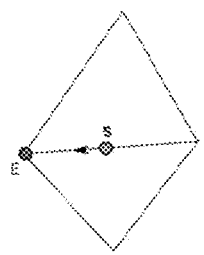
FIG. 12
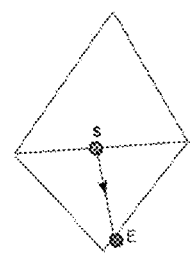
FIG. 13
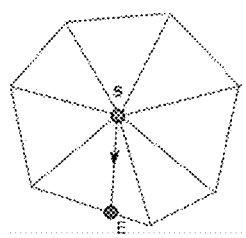
FIG. 14
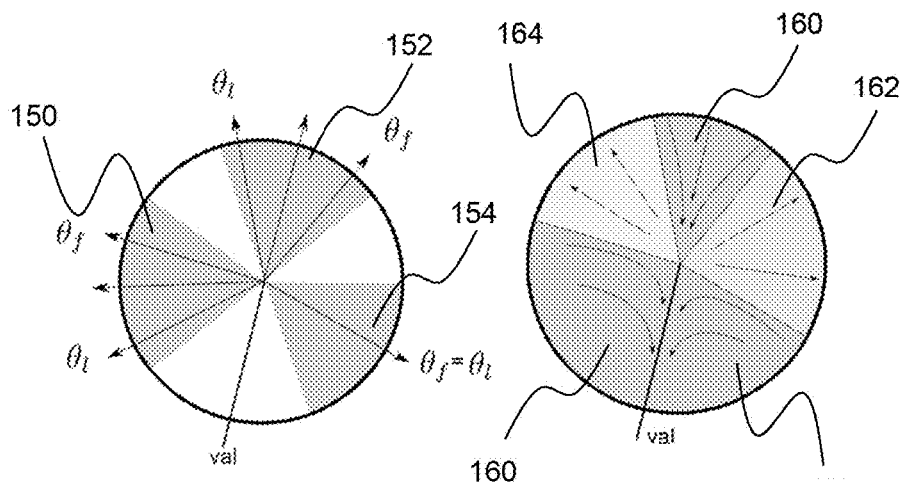
FIG. 15
FIG. 16

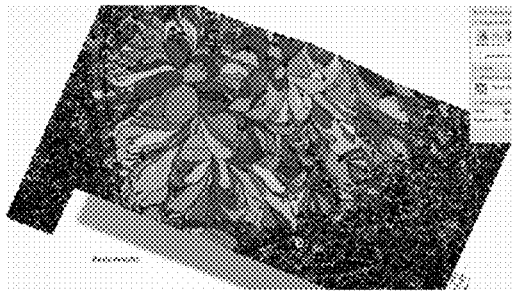
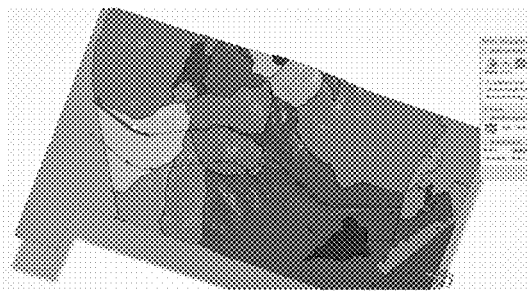
FIG. 17               FIG. 18
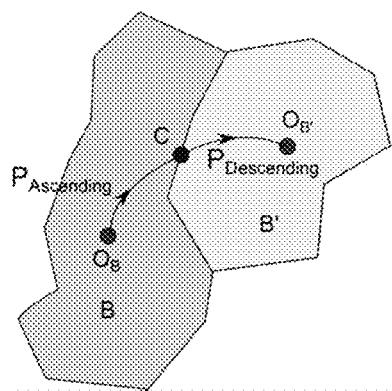
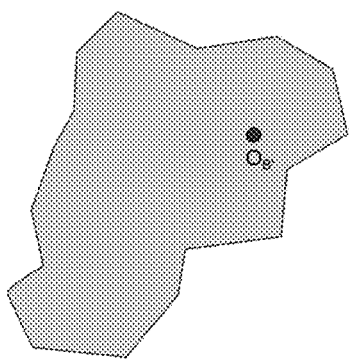
FIG. 19               FIG. 20

POLYLINE CONTRIBUTOR IN CIVIL ENGINEERING

CROSS-REFERENCE TO RELATED APPLICATIONS

This application claims priority under 35 U.S.C. § 119 or 365 to European Application No. 19306533.1, filed Nov. 28, 2019. The entire contents of the above application(s) are incorporated herein by reference.

FIELD OF THE DISCLOSURE

The disclosure relates to the field of computer programs and systems, and more specifically to methods, systems and programs for civil engineering.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Within this context and other contexts, civil engineering is gaining wide importance.

The followings papers and software relate to this field and are referred to hereunder:
 [1] Attali, D., Glisse, M., Hornus, S., Lazarus, F., & Morozov, D. (2009). Persistence-sensitive simplification of functions on surfaces in linear time. *TOPOIN-VIS*, 9, 23-24;
 [2] Autodesk Civil 3D software;
 [3] Banchoff, T. (1967). Critical points and curvature for embedded polyhedra. *Journal of Differential Geometry*, 1(3-4), 245-256;
 [4] Bentley Power Civil software;
 [5] BlueMarble GlobalMapper software;
 [6] Bremer, P.-T., Hamann, B., Edelsbrunner, H., & Pascucci, V. (2004). A topological hierarchy for functions on triangulated surfaces. Bremer, P-T; Hamann, Bernd; Edelsbrunner, Herbert; Pascucci, Valerio, 10(4), 385-396;
 [7] Čomić, L., De Floriani, L., Magillo, P., & Iuricich, F. (2014). *Morphological modeling of terrains and volume data*. Springer New York;
 [8] Danovaro, E., De Floriani, L., Magillo, P., & Mostefa Mesmoudi, M. (2003). Morphology-Driven Simplification and Multiresolution. *Proceedings of the 11th ACM international symposium on Advances in geographic information systems*, 63-70;
 [9] Edelsbrunner, H., Harer, J., & Zomorodian, A. (2003). Hierarchical Morse-Smale Complexes for Piecewise Linear 2-Manifolds. *Discrete and Computational Geometry*, 30(1), 87-107;
 [10] Forman, R. (1998). *Morse theory for cell complexes;*
 [11] Gyulassy, A., Natarajan, V., Pascucci, V., & Hamann, B. (2007). Efficient computation of Morse-Smale complexes for three-dimensional scalar functions. *IEEE Transactions on Visualization and Computer Graphics*, 1440-1447;
 [12] Kozlov, D. (2008). *Combinatorial Algebraic Topology*. Springer;
 [13] Matsumoto, Y. (2001). *An introduction to Morse Theory*. American Mathematical Society;
 [14] Meyer, F. (1994). Topographic distance and watershed lines. *Signal processing*, 38(1), 113-125;
 [15] Takahashi, S., Ikeda, T., Shinagawa, Y., Kunii, T. L., & Ueda, M. (1995). Algorithms for extracting correct critical points and constructing topological graphs from discrete geographical elevation data. *Computer Graphics Forum*, 181-192; and
 [16] Wolhuter, K. (2015). *Geometric Design of Roads Handbook*. CRC Press.

All these methods suffer from a lack of accuracy and/or robustness and/or efficiency and/or speed, and/or do not provide satisfactory results.

Therefore, there is a need for an improved method for civil engineering.

SUMMARY

It is therefore provided a computer-implemented method for civil engineering. The method comprises providing a mesh representing a terrain and a polyline on the mesh. The method further comprises computing a contributor of the polyline. The computing of the contributor comprises modifying the mesh by determining, based on the polyline, a trench below the polyline. The computing of the contributor further comprises computing a watershed segmentation of the terrain based on the modified mesh. The computing of the contributor further comprises, based on the computed watershed segmentation, identifying, on the modified mesh, a basin comprising the trench. The contributor corresponds to the identified basin.

The method may comprise one or more of the following:
 each point of the polyline corresponds to a point of the trench, and
 each point of the trench has an altitude lower than the corresponding point on the polyline;
 only one of the points of the trench is an altitude local minimum;
 the identified basin has an outlet which is the altitude local minimum;
 the computing of the contributor further comprises modifying the basin by transforming back the trench into the polyline, the modified basin being the contributor;
 the computing of the watershed segmentation comprises:
 computing an initial watershed segmentation of the terrain based on the modified mesh; and performing a regularization of the computed initial watershed segmentation;

the terrain is a construction terrain;

the polyline represents a construction on the terrain; and/or the polyline represents a road, a railroad, a channel, a building or a mine.

It is further provided a computer program comprising instructions for performing the method.

It is further provided a device comprising a data storage medium having recorded thereon the computer program.

The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g. the device is a subsystem of the overall system). The system may further comprise a graphical user interface coupled to the processor.

BRIEF DESCRIPTION OF THE DRAWINGS

Embodiments will now be described, by way of non-limiting example, and in reference to the accompanying drawings, where:

FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35 and 36 illustrate the present disclosure.

DETAILED DESCRIPTION

Figure 21:
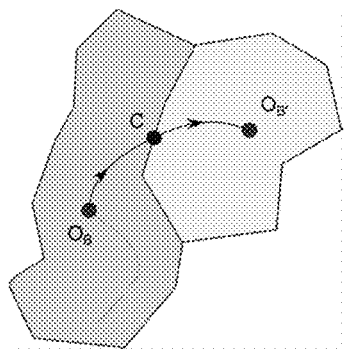

It is provided computer-implemented methods for civil engineering.

It is notably provided a first computer-implemented method for civil engineering.

The first method comprises providing a mesh representing a terrain. The first method further comprises computing a watershed segmentation of the terrain based on the mesh. The computing of the watershed segmentation includes identifying one or more saddle points on the mesh. The computing of the watershed segmentation further includes, for each identified saddle point, identifying paths each ascending from the saddle point according to a direction of a local maximal slope around the saddle point, and a path descending from the saddle point according to a direction of a steepest slope around the saddle point. The identified ascending paths divide the mesh into connected components. The computing of the watershed segmentation further includes, for each identified saddle point, merging each connected component of which bottom point is the saddle point with a connected component comprising the identified path descending from the saddle point according to a direction of a steepest slope around the saddle point. The merging yields at least a part of a basin. The first method may be referred to as "the watershed segmentation method".

The watershed segmentation method constitutes an improved method for civil engineering.

Notably, the watershed segmentation method allows to perform a watershed segmentation of a terrain represented by a mesh, i.e. to perform the segmentation of the terrain into one or more drainage basins (sometimes simply referred to as "basins" hereinafter) bounded by watershed lines (which are discussed hereinafter). The watershed segmentation method notably yields basins and watershed lines of the terrain. For example, the identified ascending paths comprise ascending watershed lines. However, at least some of the identified ascending paths are not watershed lines. The watershed segmentation of the terrain is objective physical information on the terrain that allows for example to segment the terrain into parts on which the water flow has similar behavior that is into drainage basins. This eventually allows to perform a civil engineering analysis and/or to perform one or more physical actions pertaining to civil engineering on the terrain, as further discussed hereinafter.

Furthermore, the watershed segmentation is performed based on the mesh that represents the terrain, which means that the watershed segmentation is directly performed on the input (i.e. provided) mesh, i.e. does not require any modification of the input mesh. Such a modification could indeed degrade the quality of the mesh, e.g. the degree of realism with which the input mesh represents the terrain. In contrast, as this modification does not happen with the watershed segmentation method, the watershed segmentation method is accurate and robust, and yields a relatively realistic watershed segmentation of the terrain. Also, the quality, in terms of realism of the result, of the watershed segmentation computed by the watershed segmentation method does not depend on the size and/or the regularity of the mesh.

In addition, the watershed segmentation method performs watershed segmentation on a mesh that comprises one or more saddle points. Now, as known per se from the field of civil engineering, a mesh representing a terrain almost always comprises one or more saddle points, as the terrain does in the real world. The watershed segmentation method thus allows performance of watershed segmentation on a quality mesh, as the latter comprises one or more saddle points. The watershed segmentation method is thus accurate and yields a realistic watershed segmentation of the terrain.

Moreover, the watershed segmentation computed by the watershed segmentation method is, as said, directly performed on the mesh comprising one or more saddle point. The watershed segmentation thus handles the almost inevitable presence of saddle points on the mesh without modifying the input mesh, which makes the watershed segmentation method robust and efficient. The watershed segmentation does so by identifying, for each identified saddle point, several paths each ascending from the saddle point according to a local maximal slope direction and a path descending from the saddle point with a steepest slope direction. In this manner, the watershed segmentation method divides the mesh into connected components, each bounded by two identified ascending paths. Specifically, the identifying of the paths divides the mesh into connected components each corresponding to either a connected part of the terrain having the saddle point as bottom, and on which the water necessarily flows towards the saddle point, or to a connected part of the terrain forming a steepest valley descending from the saddle point. It is to be understood that the water does not stop and stay at the saddle point: it transits/flows by it, to eventually reach altitude minima, which are basins' lowest points. The watershed segmentation method then merges each connected component having the saddle point as bottom with a valley of steepest slope around the saddle point. This merging results in a single connected component of the mesh comprising the saddle point and representing a connected part of the terrain on which the water necessarily flows downstream and into a unique basin. In other words, the single connected component forms at least a part of a basin. As such basin parts are determined for each identified saddle point, the watershed segmentation eventually determines full basins segmenting the terrain.

Furthermore, in examples, at least one of the identified one or more saddle points is a degenerate saddle point. Thus, the watershed segmentation method handles degenerate saddle points, which often exist when representing realistically a real world terrain with a mesh. The watershed segmentation method thus takes as input a realistic mesh representation of the terrain and outputs a realistic watershed segmentation of it. Moreover, the watershed segmentation method handles the degenerate saddle points without modifying the input mesh, which makes the watershed segmentation method particularly robust and efficient.

It is also provided a second computer-implemented method for civil engineering.

The second method comprises providing a watershed segmentation of a terrain. The watershed segmentation comprises basins. The second method further comprises merging first basins of the watershed segmentation that each verify a smallness criterion, each with a second basin downstream to the first basin. The second method may be referred to as "the regularization method".

The regularization method constitutes an improved method for civil engineering.

Notably, the regularization method allows regularize the provided watershed segmentation of the terrain. Regularizing the watershed segmentation means merging basins of the watershed segmentation so that the merging results into merged basins, also referred to as filtered basins, each violating the smallness criterion. In other words, the merging results into large filtered basins.

Regularizing the watershed segmentation of the terrain as does the regularization method notably allows to get rid (or at least to reduce the number of) small basins which correspond to numerical artefacts and/or noise. In other words, depending on how the provided watershed segmentation has been computed, the watershed segmentation may comprise one or more basins which are not supposed to exist in the real world, but which exist numerically because of numerical artefacts and/or noise. The numerical artefacts and/or the noise may result from physical measurements performed to acquire data on the terrain (this is further discussed hereinafter), e.g. to obtain a mesh representing the terrain. Alternatively or additionally, the numerical artefacts and/or the noise may correspond to non-significant details about the terrain (e.g. a molehill). These basins respect the smallness criterion. The regularization method filters these basins by merging them into larger ones.

Additionally or alternatively, one or more basins may each verify the smallness criterion because they are small in the real world. However, they are so small that they are not meaningful to the civil engineer, e.g. they do not influence much the water trajectory and/or other physical phenomenon on the terrain because of their smallness. Only larger filtered basins may have such an influence. The regularization method allows obtaining of such filtered basins. In other words, the regularization method yields a filtered segmentation which is meaningful to the civil engineer.

In any case, where, as previously discussed, the watershed segmentation constitutes an objective physical information allowing a civil engineering analysis and/or one or more civil engineering physical actions to be performed, regularizing this watershed segmentation according to the watershed segmentation method improves relevance of this physical information.

Furthermore, the regularization method does not modify the representation of the terrain (e.g. a mesh) to perform the regularization of the watershed segmentation. Notably, the regularization method does not modify any basin's characteristics as such, but only merges basins. As previously discussed in the context of the watershed segmentation method, not modifying the representation of the terrain (e.g. a mesh) contributes to improve the realism of the results yielded by the regularization method.

It is also provided a third computer-implemented method of civil engineering.

The third method comprises providing a mesh representing a terrain and a polyline on the mesh. The third method further comprises computing a contributor of the polyline. The computing of the contributor comprises modifying the mesh by determining, based on the polyline, a trench below the polyline. The computing of the contributor further comprises computing a watershed segmentation of the terrain based on the modified mesh. The computing of the contributor further comprises, based on the computed watershed segmentation, identifying, on the modified mesh, a basin comprising the trench. The contributor corresponds to the identified basin. The third method may be referred to as "the contributor computation method".

The contributor computation method constitutes an improved method for civil engineering.

Notably, the contributor computation method allows to compute the contributor of a polyline, that is a contributor (i.e. an area of the terrain from which water necessarily flows towards the polyline and reaches it) of two or more points connected by line segments. The polyline may typically represent an alignment on the terrain such as a road, a railroad, a channel, a mine or a building. The contributor thus constitutes objective physical information for civil engineering, as it allows determination of the water trajectory of the water flowing across the polyline. This objective physical information may be used for performing a civil engineering analysis and/or one or more civil engineering physical actions, as further discussed hereinafter.

Furthermore, the contributor computation method proceeds in three steps: modifying the mesh by creating a trench below the polyline, computing basins of the modified mesh by computing a watershed segmentation of the modified mesh, identifying a basin on the segmentation that corresponds to the contributor. Moreover, these three steps compute the contributor of the polyline using a single operation, i.e. these steps compute all points (e.g. mesh vertices) of the contributor all at once, and not one by one. This makes the contributor computation method fast, robust, efficient, and accurate. Furthermore, the produced results are consistent with the results of the watershed segmentation. Besides, the computation is not affected by/does not depend on the complexity and/or the accuracy of the polyline, which makes the contributor computation method further robust and efficient.

The watershed segmentation method, the regularization method and the contributor computation method may be performed independently from each other. Alternatively, the watershed segmentation method, the regularization method and/or the contributor computation method may be combined. For example, the watershed segmentation provided according to the regularization method may be the watershed segmentation computed according to the watershed segmentation method. For example, the providing of the watershed segmentation of the regularization method may comprise the providing of the mesh representing the terrain according to the watershed segmentation method and the computing of the watershed segmentation according to the watershed segmentation method, the computed watershed segmentation being the provided watershed segmentation. Additionally or alternatively, the computing of watershed segmentation according to the contributor computation method may be carried out according to the computing of watershed segmentation according to the watershed segmentation method.

The watershed segmentation method, the regularization method and/or the contributor computation method may be integrated into a same process of civil engineering, also referred to as "the civil engineering process". In other words, the civil engineering process comprises performing one or more of the watershed segmentation method, the regularization method and/or the contributor computation method.

Specifically, the civil engineering process comprises providing a mesh representing a terrain.

The civil engineering process may in examples further comprise a step of understanding the topography of the terrain. Understanding the terrain may comprise identifying elements of the terrain such as ridges and/or valleys. Understanding the terrain may start by computing, by a user, the slope on the terrain, e.g. on each triangle of the mesh. Understanding the terrain may then comprise estimating, by a user, valleys and ridges. Valleys and ridges provide the user with enough information for launching the computation of the watershed segmentation on a portion of the terrain of particular interest. They also allow the user to deduce new information (e.g. estimation of water quantity received by an outlet for dimensioning drainage systems). It is to be noted that the contributor computation may replace the computation of the watershed segmentation, e.g. when the user is conceiving a work of art. The user may also modify a road alignment if the contributor computation indicates that drainage systems are not going be sufficient: this allows looping back between the work of art conception and the estimation of the quantity of water.

The civil engineering process may then comprise computing a watershed segmentation of the terrain based on the mesh, the computing of the watershed segmentation being the computing of watershed segmentation according to the watershed segmentation method. The civil engineering process may then comprise regularizing the computed watershed segmentation by merging first basins of the computed watershed segmentation that each verify a smallness criterion, each with a second basin downstream to the first basin, the merging being the merging of the regularization method. This improves robustness as the small (e.g. shallow) basins of the computed watershed segmentation are thereby filtered.

Additionally or alternatively, the civil engineering process may comprise providing a polyline on the mesh, according to the contributor computation method, and computing a contributor of the polyline according to the contributor computation method. The computing of the contributor comprises computing a watershed segmentation of the terrain based on the modified mesh, as previously discussed. The computing of the watershed segmentation may comprise computing, according to the watershed segmentation method, an initial watershed segmentation of the terrain based on the modified mesh and performing a regularization of the computed initial watershed segmentation, according to the regularization method. This is further discussed hereinbelow.

The civil engineering process thus yields one or more of: a watershed segmentation method computed by the watershed segmentation method and/or regularized by the regularization method and/or a contributor of a polyline computed by the contributor computation method. The civil engineering process may further comprise displaying the computed and/or regularized watershed segmentation and/or the computed contributor. The process thus allows, e.g. based on the display, to determine the trajectory of the water flowing across some part of the terrain and/or to segment the terrain into part on which the water flow has similar behavior. This allows performance of civil engineering analysis on the terrain, as discussed hereinafter.

The civil engineering process may further comprise performing a civil engineering analysis based on the computed and/or regularized watershed segmentation and/or the computed contributor. The civil engineering process may further comprise performing one or more physical actions based on the civil engineering analysis, the computed and/or regularized watershed segmentation, and/or the computed contributor. The civil engineering analysis and/or the one or more physical actions may be performed while the computed and/or regularized watershed segmentation and/or the computed contributor is/are displayed on a computer display. This allows to guide the civil engineer when performing the task of civil engineering analysis and/or when performing one or more physical actions.

Specifically, each one of the computed and/or regularized watershed segmentation and of the computed contributor forms objective physical information based on which the civil engineering analysis and/or the one or more physical actions may be performed, e.g. based on the display of said objective physical information. The one or more physical actions may also be performed based on the civil engineering analysis.

The civil engineering analysis may comprise analyzing and/or designing the terrain and/or human construction on the terrain, based on (e.g. the display of) the computed and/or regularized watershed segmentation and/or the computed contributor. The civil engineering may comprise one or more of the following:

Topographic analysis, e.g. based on (e.g. the display of) the computed and/or regularized watershed segmentation;

Determination of water flow on the terrain, e.g. based on (e.g. the display of) the computed and/or regularized watershed segmentation;

Segmenting the terrain into watersheds, e.g. based on (e.g. the display of) the computed and/or regularized watershed segmentation;

Visualizing an area of the terrain from which the rainfall is to reach a particular area of interest, such as a planned or existing road alignment, e.g. based on (e.g. the display of) the computed contributor of the particular area of interest (e.g. road alignment), the polyline representing the particular area of interest (e.g. road alignment);

Sizing of drainage tools for draining one or more ditches on the terrain e.g. around a road, a railroad, a channel, a mine and/or a building, e.g. based on (e.g. the display of) the computed contributor of the road, the railroad, the channel, the mine and/or the building, the polyline representing the road, the railroad, the channel, the mine and/or the building;

Designing one or more rainwater drainage systems, e.g. based on (e.g. the display of) the computed and/or regularized watershed segmentation;

Designing a drainage basin for a planned or existing road alignment, e.g. based on (e.g. the display of) the computed contributor of the road alignment, the polyline representing the road alignment;

Determination of the influence of water flow on one or more urban constructions on the terrain, e.g. based on (e.g. the display of) the computed and/or regularized watershed segmentation and/or each computed contributor of each respective one of said urban constructions, the polyline representing the respective one of said urban constructions;

Modifying the design of a human construction to be constructed on the terrain, e.g. based on (e.g. the display of) the computed and/or regularized watershed segmentation and/or the computed contributor of the construction, the polyline representing the construction;

Determination of the influence of building a dam on the terrain, e.g. based on (e.g. the display of) the computed and/or regularized watershed segmentation and/or the computed contributor of the dam, the polyline representing the dam;

Determination of the influence of a dyke implantation, e.g. based on (e.g. the display of) the computed and/or regularized watershed segmentation and/or the computed contributor of the dyke, the polyline representing the dyke; and/or Determination of the influence of water flow on a mine of the terrain and/or determination of the influence of building the mine on the terrain, e.g. based on (e.g. the display of) the computed and/or regularized watershed segmentation and/or the computed contributor of the mine, the polyline representing the mine.

The one or more physical actions may comprise performing natural risk management and/or construction work and/or maintenance work on the terrain and/or on one or more human constructions on the terrain, based on (e.g. the display of) the computed and/or regularized watershed segmentation, the computed contributor and/or the civil engineering analysis. The one or more physical actions may notably comprise one or more of the following:

performing natural risk management based on water flow estimation, e.g. stemming from the computed and/or regularized watershed segmentation, the computed contributor and/or the civil engineering analysis. The natural risk management may comprise determining whether the risk associated with the implementation of a structure at a given location is acceptable. This may comprise determining the quantity of water received around the given location and comparing it with means of prevention (e.g. dike, drain);

Constructing and/or modifying one or more roads, railroads, channels, mines and/or buildings on the terrain. The constructing and/or the modifying may be based on (e.g. a display of) the computed contributor of each road, railroad, channel, mine and/or building, the polyline representing the road, railroad, channel, mine and/or building. Additionally or alternatively, the constructing and/or the modifying may be based on the result of the civil engineering analysis. The result may comprise one or more of:
the topographic analysis,
the determined water flow on the terrain,
the topography of the terrain,
the watersheds segmenting the terrain,
the area from which the rainfall is to reach the road, railroad, channel, mine and/or building,
the determined influence of water flow on the one or more roads, railroads, channels, mines and/or buildings,
the modified design of the road, railroad, channel, mine and/or building,
the determined influence of building a dam on the terrain,
the determined influence of a dyke implantation;

Constructing and/or modifying a dam on the terrain. The constructing and/or the modifying may be based on (e.g. a display of) the computed contributor of the dam, the polyline representing the dam. Additionally or alternatively, the constructing and/or the modifying may be based on the result of the civil engineering analysis. The result may comprise one or more of:
the topographic analysis,
the determined water flow on the terrain,
the topography of the terrain,
the watersheds segmenting the terrain,
the determined influence of building the dam on the terrain,
the determined influence of a dyke implantation or of a drainage system, Constructing and/or modifying a road alignment. The constructing and/or the modifying may be based on (e.g. a display of) the computed contributor of the road alignment, the polyline representing the road, alignment. Additionally or alternatively, the constructing and/or the modifying may be based on the result of the civil engineering analysis. The result may comprise one or more of:
the topographic analysis,
the determined water flow on the terrain,
the topography of the terrain,
the watersheds segmenting the terrain,
the area from which the rainfall is to reach the road alignment,
the designed drainage basins for the road alignment,
the determined influence of water flow on the road alignment,
the determined influence of building a dam on the terrain,
the determined influence of a dyke implantation;

Constructing and/or modifying a mine on the terrain. The constructing and/or the modifying may be based on (e.g. a display of) the computed contributor of the mine, the polyline representing the mine. Additionally or alternatively, the constructing and/or the modifying may be based on the result of the civil engineering analysis. The result may comprise one or more of:
the topographic analysis,
the determined water flow on the terrain,
the topography of the terrain,
the watersheds segmenting the terrain,
the area from which the rainfall is to reach the mine,
the modified design of the mine,
the determined influence of a dyke implantation,
the determined influence of building a dam on the terrain,
the determined influence of water flow on the mine and/or of the influence of building the mine on the terrain;

Terraforming, e.g. around a human construction on the terrain. The terraforming may be based on (e.g. a display of) the computed and/or regularized watershed segmentation. Additionally or alternatively, the terraforming may be based on the result of the civil engineering analysis. The result may comprise one or more of:
the topographic analysis,
the determined water flow on the terrain,
the topography of the terrain, the watersheds segmenting the terrain,
the determined influence of water flow on the construction,
the modified design of the construction,
the determined influence of building a dam on the terrain,
the determined influence of a dyke implantation;

Constructing one or more water management systems on the terrain. The constructing may be based on (e.g. a display of) the computed and/or regularized watershed segmentation. Additionally or alternatively, the constructing may be based on the result of the civil engineering analysis. The result may comprise one or more of:
the topographic analysis,
the determined water flow on the terrain,
the topography of the terrain,
the watersheds segmenting the terrain,
the sized drainage tools for draining one or more ditches on the terrain,
the designed one or more rainwater drainage systems,
the determined influence of water flow on the one or more constructions on the terrain,
the determined influence of building a dam on the terrain,
the determined influence of a dyke implantation; and/or Constructing one or more drainage systems on the terrain. The constructing may be based on (e.g. a display of) the computed and/or regularized watershed segmentation. Additionally or alternatively, the constructing may be based on the result of the civil engineering analysis. The result may comprise one or more of:
the topographic analysis,
the determined water flow on the terrain,
the topography of the terrain,
the watersheds segmenting the terrain,
the sized drainage tools for draining one or more ditches on the terrain,
the designed one or more rainwater drainage systems,
the determined influence of water flow on the one or more constructions on the terrain,
the determined influence of building a dam on the terrain,
the determined influence of a dyke implantation.

The methods and process are for civil engineering.

As known per se, civil engineering is a field of engineering that encompasses the study of means of transport and of work of arts, including public works such as roads, bridges, channels, dams, airports, sewerage systems, pipelines, structural components of buildings, and railways. Thus, each one of the methods and the process pertains to determining and/or computing objective physical information (i.e. a watershed segmentation, a regularized watershed segmentation and/or a contributor) on a terrain that pertains to civil engineering. Each one of the methods and process also belong to the field of topography analysis and geometrical simulation, as they allow to determine the trajectory of the water flowing across some part of the terrain, and/or to segment the terrain into part on which the water flow has similar behavior.

In the context of the present disclosure, a terrain is a portion of the soil surface of the earth. A terrain has landform. In the context of the present disclosure, the terrain is impervious, i.e. the water only flows on the terrain surface without any permeation phenomenon. Impervious terrains are often contemplated in civil engineering methods for several objective physical reasons. For example, in an urban context, the terrain being at least partially urbanized, most of the soil has been made impervious due to permanent covering of the soil surface with an impermeable material. Even in non-urban context, the soil capacity to absorb water is reached in case of heavy rainfall: the soil is then considered as impervious because water can no longer infiltrate into the ground.

Each terrain herein may be a construction terrain. A construction terrain is a terrain:
comprising one or more human constructions such as roads, bridges, channel, mines, dams, airports, sewerage systems, pipelines, buildings, structural components of buildings and/or railways; and/or
on which one or more human constructions such as roads, bridges, channel, mines, dams, airports, sewerage systems, pipelines, buildings, structural components of buildings and/or railways are to be constructed, e.g. based on a civil engineering analysis.

Each terrain herein is represented by a discrete geometrical representation. Said otherwise, the civil engineering methods herein are each performed on a discrete geometrical representation of a terrain. Each one of the civil engineering methods and process herein may notably comprise providing a geometrical representation of the terrain. For example, the watershed segmentation method and the contributor computation method both comprise providing, as a discrete geometrical representation of the terrain, a mesh representing the terrain.

The discrete geometrical representation of the terrain is herein a data structure which comprises a discrete set of pieces of data. Each piece of data represents a respective geometrical entity (e.g. a point, a surface) of the terrain. Each geometrical entity represents a respective location of the terrain (in other words, a respective portion of the soil surface). The aggregation (i.e. union or juxtaposition) of the geometrical entities represents altogether the terrain. Any discrete geometrical representation herein may in examples comprise a number of such pieces of data higher than 1000000. The discrete geometrical representation may be two-dimensional or three-dimensional.

The discrete geometrical representation of the terrain may be a mesh, each geometrical entity being a mesh element such as a tile or face. Any mesh herein may be a 3D mesh or a 3D mesh. Any mesh herein may be regular or irregular (i.e. consisting or not of faces of a same type). Any mesh herein may be a polygonal mesh, for example a triangular mesh, the mesh faces being triangles, each bounded by mesh edges, each bounded by mesh vertices. Any mesh herein may be obtained from a point cloud, for example by triangulating the point cloud (e.g. with a Delaunay triangulation).

Any mesh representing a terrain herein may stem from (i.e. may be determined from) physical measurements performed on the terrain, for example within a reconstruction process. The reconstruction process may comprise performing one or more Lidar surveys of the terrain, as known per se from the field of civil engineering. The reconstruction process may additionally or alternatively comprise one or more surveys by triangulation of parts of the terrain, as known per se from the field of civil engineering. The reconstruction process may alternatively or additionally comprise performing photogrammetry on the terrain, as known per se from the field of civil engineering. The Lidar surveys, the surveys by triangulation and/or the photogrammetry may yield a point cloud representing the terrain, and the reconstruction process may further comprise triangulating the point cloud to obtain the mesh. Any mesh representing a terrain herein may be a Digital Elevation Model, as known per se from the field of civil engineering. Additionally or alternatively, any mesh representing a terrain herein may be a 3D triangular mesh that can be parametrized by a 2D subset D of the Oxy plane. In other words, the projection of the mesh triangles induces a triangulation of the domain D, which entails that there is no overhanging triangle in the mesh.

The watershed segmentation method and the contributor computation method both comprise providing a mesh representing a terrain. Providing the mesh representing the terrain may comprise building the mesh, for example by performing a reconstruction process as previously discussed. Alternatively, providing the mesh may comprise retrieving the mesh form a (e.g. distant) memory on which the mesh has been stored after its building.

Information related to water trajectory on the terrain, such as watershed segmentation or contributors, constitutes objective physical information for civil engineering, based on which a civil engineer can perform a civil engineering analysis and/or one or more physical actions as previously discussed. Concepts related to water trajectory are now discussed.

The altitude on the terrain may be encapsulated by an altitude function $f$ which is defined on the discrete geometrical representation of the terrain and which takes real values. The value of $f$ at a point of the discrete geometrical representation corresponds to the altitude at this point. Note that when $f$ is differentiable, its gradient is a vector which represents the steepest slope at each point.

A point A of the discrete geometrical representation is said to flow toward a point B if there is a unique downward path from A to B on the discrete geometrical representation and if for any point P on that path, the tangent vector of the path at point P is collinear to the slope vector grad($f$(P)). In other words, the path follows the maximal downward (also referred to as "descending") slope. The path may be referred to as a flow line.

A drainage basin (also simply referred to as "basin") of the terrain is represented on the discrete geometrical representation by a set of points that will flow toward the same point. This point represents an outlet of the basin and is a local minima of the altitude function. In other words the drainage basins are the attraction points of the water flow induced by the opposite of the gradient of the altitude function. As a result of the watershed segmentation performed by the watershed segmentation method, the boundaries of the basins are represented on the discrete geometrical representation by the watershed lines. The watershed lines divide the water flow so that any pair of points lying from either side of the watershed lines will give rise to two paths that will reach two different outlets. It is to be noted that, in examples where the terrain is represented by a triangle mesh, the boundaries of the basins are polylines which each may or may not pass through mesh triangles.

The contributor of a subset S of the discrete geometrical representation of the terrain is the set of points of the terrain from which a path will reach a point of S, that is from which water will flow towards a point of S. For example, the contributor of a local minimum of the altitude function is given by the drainage basin associated to that outlet.

In the context of the present disclosure, a watershed segmentation of the terrain is a segmentation of the discrete geometrical representation of the terrain into parts of the discrete geometrical representation each representing a respective basin of the terrain. Boundaries of each respective one of these parts are the watershed lines of the respective basin represented by the respective one part and represent the boundaries of the respective basin. Any watershed segmentation herein may further comprise data representing one or more physical properties within basins of the watershed segmentation. Such a physical property may for example be water trajectory within each basin of the watershed segmentation.

A basin depth is the difference of altitude between the spillway (i.e. the lowest saddle point on the basin boundary, lowest meaning having the smaller altitude) and the outlet. This quantity represents the maximal height of water this basin may contain before flooding in the downstream basin. The basin volume is the volume of the solid delimited downward by the basin and upward by the horizontal plane containing the lowest saddle point on the basin boundary.

FIG. 1 shows an example of a terrain 10. The terrain comprises a drainage basin 12 having an outlet 14 and a spillway 16. Double arrow 18 represents the depth of the drainage basin 12.

The watershed segmentation method is now further discussed.

"Computing a watershed segmentation of the terrain based on the mesh" means determining watershed lines of the terrain by computing the representations of these watershed lines on the provided mesh. Equivalently, "computing watershed segmentation of the terrain" means determining drainage basins of the terrain by computing the representations of these drainage basins on the provided mesh. The computing of the watershed segmentation thus takes as input the provided mesh and determines a segmentation of the terrain into drainage basins by computing the representations on the mesh of the watershed lines of these drainage basins. In other words, the watershed segmentation method outputs parts of the mesh (e.g. sets of faces, e.g. triangles) each representing a respective drainage basin.

The computing of the watershed segmentation includes identifying one or more saddle points on the mesh. A saddle point on the mesh is a vertex which represents a saddle point of the terrain. A saddle point of the terrain is a point having at least two locally maximal descending directions and at least two locally maximal ascending directions the soil surface forming for example a landform saddle or a mountain pass around the saddle point. This is illustrated in FIG. 2. In the case of a saddle point of a regular surface, the descending directions are opposed, and the ascending directions are as well opposed. This is in general not the case for saddle points on a triangular surface.

In examples of the watershed segmentation method, the mesh is a 3D triangular mesh having triangles, edges, and vertices. In these examples, a saddle point of the mesh may be defined as follows. The star of a vertex V of the mesh is the set of triangles and edges that contain V (i.e. V is a vertex of these triangles and edges): the star of V is denoted St(V). The upper star (resp. lower star) of vertex V is the set of simplices of the star St(V) such that the value of $f$ at any vertex other than V is greater (resp. lower) than $f$(V). In other words, a simplex $s \in$ St(V) belongs to the upper star if $f(W) > f(V)$ for any vertex W of s different of V. FIG. 3 shows a part of the mesh in an example of the watershed segmentation method, the part of the mesh comprising a vertex v. FIG. 3 shows the star 30 of V. FIG. 4 shows the same part of the mesh and shows the link 40 of the vertex v. As, in these examples, the terrain is represented by a triangular mesh, the altitude function is piecewise linear (PL).

In these examples, critical points of the mesh are defined using the previous notions of upper and lower star (see previously cited reference [3], which is incorporated herein by reference). Specifically, a regular point which is not a critical point is a vertex for which the upper and lower stars are formed by exactly one connected component. A local minimum is a vertex for which the lower star is empty (and the upper star consists in a single connected component). A local maximum is a vertex for which the lower star is empty (and the upper star consists in a single connected component). A saddle point is a critical point of the altitude function and is a vertex for which the lower and the upper star consist in at least two connected components. Equivalently it's a critical point of the altitude function which is not a local minimum and not a local maximum.

FIGS. 5 to 10 illustrate these concepts, where upper stars are shaded and where lower stars are not. FIG. 5 shows a vertex and its incident edges. FIG. 6 shows the case where the vertex is a critical bottom (local minimum). FIG. 7 shows the case where the vertex is a critical top (local maximum). FIG. 8 shows the case where the vertex is a regular vertex. FIG. 9 shows the case where the vertex is a regular saddle point. FIG. 10 shows the case where the vertex is a monkey saddle (the upper and lower star have tree connected components).

The identifying of the one or more saddle points may be carried out by any known method adapted for identifying saddle points on a mesh. In examples where the mesh is a 3D triangular mesh, the identifying of the one or more saddle points may comprise, for each vertex of the mesh, determining whether the vertex is a saddle point. Determining whether the vertex is a saddle point may comprise:
- computing the lower star of the vertex and the upper star of the vertex by comparing the altitude of the neighboring vertices of the vertex; and
- determining that the vertex is a saddle point if the computed lower star has at least two connected components and if the computed upper star has at least two connected components.

If the vertex is an interior vertex of the mesh, i.e. a vertex that is not a boundary vertex, it is sufficient to analyze only the lower star of the vertex, since it is the complement of the upper star on the circle of directions (which is discussed hereinafter) and the two have the same number of related components. In such a case, if the vertex is an interior vertex of the mesh, determining whether the vertex is a saddle point may comprise:
- computing the lower star of the vertex by comparing the altitude of the neighboring vertices of the vertex; and
- determining that the vertex is a saddle point if the computed lower star has at least two connected components.

This does not hold if the vertex is a boundary vertex of the mesh.

The determining of whether the vertex is a saddle point may be carried out by executing an algorithm which may be referred to as the "Determine if a vertex V is a saddle point" algorithm and which is described by the following pseudo-code:

```
BEGIN ALGORITHM (Determine if a vertex V is a saddle point)
    - Compute the lower star Lo(V) of the vertex V by comparing
      the z-coordinate of the neighboring vertices
    - If Lo(V) has at least 2 connected components
        Return true
      Else
        Return false
END ALGORITHM
```

It is to be understood that the watershed segmentation method may identify all the saddle points in the mesh or at least a part of them. In examples, the watershed segmentation method identifies all the saddle points in the mesh.

In examples, at least one of the identified one or more saddle points is a degenerate saddle point. A degenerate saddle point on the mesh is a vertex of the mesh which represents a degenerate saddle point of the terrain. A degenerate saddle point of the terrain is a point around which the soil surface curves up in at least two directions and curves down in at least three other directions. In fact, if the saddle point corresponds to an interior vertex of the mesh, there exists three directions of locally maximal descent around the saddle point. In examples of the watershed segmentation method, an interior degenerate saddle point on the mesh is a saddle point on the mesh for which the lower star comprises at least three connected components and the upper star comprises at least three connected components.

The computing of the watershed segmentation further includes, for each identified saddle point, identifying paths each ascending from the saddle point according to a direction of a local maximal slope around the saddle point. A path ascending from the saddle point is a path on the mesh that starts at the saddle point and that goes up the mesh such that the altitude increases along the path until the path reaches an ending point which is either on a boundary of a basin or on a boundary of the terrain. For example, the ending point may correspond to a local maxima of the altitude function and/or may be on the boundary of the mesh. The path ascends from the saddle point up to the ending point according to a direction of a local maximal slope. This means that the path tends to follow where the slope is maximal when going up to the ending point. Said otherwise, the path starts at the saddle point by going up a local maximal slope around the saddle point (there may be many such local maximal slope) and then tends to always go up according to the steepest ascending direction. It is to be noted that the identified ascending paths may be any path on the mesh, i.e. they do not necessarily follow the mesh edges and can cross mesh faces. The identifying of the ascending paths may be carried out by any known method adapted for such purpose.

In examples, the identifying of the paths ascending from the saddle point comprises determining slope local maxima around the saddle point. In these examples, each respective one of said paths ascending from the saddle point is directed according to a determined slope local maxima. This is an efficient manner of identifying the ascending paths, because it ensures that the ascending paths start from the saddle point in the steepest possible directions.

As said, each ascending path starts at the saddle point by going up a local maximal slope around the saddle point and there may be several such local maximal slope. In these examples, the identifying of the paths comprises determining the local maximal slope, by determining slope local maxima around the saddle point. Determining slope local maxima means finding the steepest ascending directions on the saddle point. Determining slope local maxima may comprise computing the radial slope around the saddle point, i.e. computing the ascending directions that extend radially about the saddle point. Determining slope local maxima may further comprise determining the local maxima of the computed radial slope around the saddle point, such that the determined slope local maxima around the saddle point are in examples local maxima of the radial slope around the saddle point. This improves simplicity and efficiency of the watershed segmentation method.

In examples, the identifying of the paths ascending from the saddle point comprises projecting mesh elements comprising the saddle point onto a plane. In these examples, the radial slope around the saddle point is a direction angle around a projection of the saddle point in the plane. These examples are now discussed.

In these examples, the mesh may be parametrized by a 2D subset of the Oxy plane (i.e. which is the plane onto which the mesh elements are projected), the 2D subset being a domain. In other words, the projection of the mesh elements (e.g. mesh tiles or faces, such as triangle faces) induces a meshing of the 2D subset. In examples of these examples, the mesh is a 3D triangular mesh (i.e. the mesh elements are triangles) and may be parametrized by a 2D subset of the Oxy plane, the 2D subset being a domain. In these examples, the projection of the triangles induces a triangulation of the domain, i.e. there are no overhanging triangles in the 3D triangular mesh.

Projecting the mesh elements may comprise computing the parametrization of the mesh by the 2D subset. Additionally or alternatively, projecting the mesh elements may comprise providing the parametrization, e.g. by retrieving it from a (e.g. distant) memory where it has been stored after its computing. In any case, the projecting of the mesh elements onto the Oxy plane yields the 2D subset or at least a part of the 2D subset comprising the projection of the mesh elements comprising the saddle point.

The saddle point, being part of the projected mesh elements, is also projected on the plane. The projection of the saddle point is thus a 2D point of the 2D subset which is the pole of a polar coordinate system parametrizing the plane. The direction angle around the saddle point is the angle of the polar coordinate system, and thus belongs to [0,2π]. The radial slope around the saddle point is then a function of the direction angle, the function being any function which takes as input a direction angle (i.e. belonging to [0,2π]) and which outputs the slope in the direction of the direction angle. The outputted slope in the direction of the direction angle is the radial slope in the direction of the direction angle. The watershed segmentation method thus determines the direction(s) of local maximal slope around the saddle point in an efficient, robust and simple manner, by reducing this determination to a simple and robust computation of local maxima of a function of the direction angle.

As previously discussed, the watershed segmentation method comprises determining the local maxima of this radial slope, e.g. according to any known method for determining local maxima of the function of the direction angle.

The identifying of the paths each ascending from the saddle point may further comprise, after determining each direction of a local maximal slope, computing each path starting from the saddle point according to one direction of a local maximal slope and ascending up to an ending point according to a steepest ascending slope, as previously discussed. The computing of each path may be carried out according to any method able to compute a steepest ascending path from a given point P on the mesh.

An example of such a method is now discussed. In this example, the mesh is a 3D triangular mesh. In this example, the watershed segmentation method takes as input any point of the mesh and compute a path ascending from this point according to the steepest ascent direction. This may be carried out by executing the following algorithm, which may be referred to as the "Compute Ascending path from a point P" algorithm, and which is described by the following pseudo-code:

```
BEGIN ALGORITHM (Compute Ascending path from a point P)
While (P is not a maximum and P is not on the terrain boundary)
    - If P lies inside the interior a triangle T
        o   Move P along the steepest ascent direction until it reaches a
            point of the boundary of T
    - If P lies inside an edge interior e=[v₁, v₂]
        o   If e is a ridge
                ■   Move P to the uppermost extremity of e
        o   Else, let T1 and T2 the two triangles sharing e, and let T1 be
            the upward triangle
                ■   Move P along the steepest ascending direction in T1
                    until it reaches a point on T1 boundary
    - If P is a vertex,
        o   Consider all the slopes around P (could be the slope on a
            triangle having P on its boundary; or an edge having P as one
            its extremity), and determine the entity s of maximal
            ascending slope
                ■   If s is an edge → Move P to the uppermost extremity
                    of s
                ■   If s is a triangle → Move P along the steepest
                    ascending direction in T1 until it reaches a point on s
                    boundary
END ALGORITHM
```

FIGS. 11 to 14 illustrate different kinds of drop moves. FIG. 11 shows a drop move from inside a triangle. FIG. 12 shows a drop move along a ridge. FIG. 13 shows a drop move through a triangle. FIG. 14 shows a drop move from a mesh vertex.

It is to be understood that the computing of each ascending paths may comprise applying the above algorithm when P is the saddle point and for each steepest ascent direction around P, such that each path ascending from P according to a steepest ascent direction is computed by the above algorithm.

The computing of the watershed segmentation further includes, for each identified saddle point, identifying a path descending from the saddle point according to a direction of a steepest slope around the saddle point. By "a path descending from the saddle point according to a direction of a steepest slope around the saddle point", it is meant "the steepest descending path around/from the saddle point". The path descending from the saddle point according to the direction of a steepest slope around the saddle point may also be referred to as the valley of steepest descent around the saddle point. The steepest descent is such that, by following it, any drop of water will flow toward a local minimum critical point of the altitude function and/or a point located on the boundary of the terrain.

The identifying of the path descending from the saddle point according to the direction of the steepest slope around the saddle point may comprise computing a slope global minimum around a saddle point. The slope global minimum is in example a global minimum of the radial slope around the saddle point and computing it may comprise determining the global minimum of the radial slope around the saddle point. Determining the global minimum of the radial slope may be carried out by projecting the mesh elements comprising the saddle point onto the plane and computing the global minimum of the previously discussed function of the direction angle around the saddle point. The identifying of the path descending from the saddle point according to the direction of the steepest slope may comprise computing the path starting at the saddle point according to the direction of steepest decent (e.g. the direction of the minimal radial slope around the saddle point) and descending from the saddle point always according to the steepest possible descent direction.

In examples, there are two valley of steepest descent around the saddle point (i.e. same unit vector). In these examples, the identifying of the path descending from the saddle point may comprise applying a symbolic perturbation to the mesh (but without modifying the geometry) and determining the lowest unitary vector among the two valleys, i.e. the unitary vector of a valley that corresponds to the steepest descent around the saddle point. Determining whether a first unitary vector is lower than a second unitary vector comprises comparing the z-coordinates of the first and second unitary vectors. In case of an equality, determining whether the first unitary vector is lower than the second unitary vector comprises then comparing the x-coordinates of the two vectors, and then the y-coordinates in case of an equality between the x-coordinates.

For each identified saddle point, the identified ascending paths divide at least a part of the mesh into connected components. The identified ascending paths indeed all intersect at the saddle point and the connected components are each a connected part of the mesh bounded by two identified ascending paths and comprising no other identified ascending paths. All the ascending paths identified for all identified saddle points fully divide the mesh into such connected components.

In examples, the identifying of the paths ascending from the saddle point comprises, for each mesh element comprising the saddle point and comprising at least two local maxima of the radial slope, retrieving, among couples of local maxima of the at least two local maxima of the radial slope, a couple of local maxima of which directions form a maximal angle in the projection of the mesh element. The respective directions of the local maxima of the couple yield one of said connected components. These examples are now further discussed.

In these examples, each mesh element comprising the saddle point is projected onto a plane as previously discussed. Then, the identifying of the paths comprises determining each direction angle around the projection of the saddle point on the plane which corresponds to a local maxima of the radial slope, as previously discussed. Each projected mesh element comprises either no local maxima of the radial slope, e.g. if the mesh element belongs to the lower star of the saddle point, or one or more local maxima of the radial slope, e.g. if the mesh element belongs to the upper star of the saddle point. For each mesh element comprising at least two local maxima of the radial slope, the watershed segmentation method retrieves the two local maxima of the radial slope which correspond to two respective direction angles forming a maximal angle in the projection of the mesh element. The angle is maximal among all angles formed by couples of respective direction angles. The identified ascending paths which ascend from the saddle point according to the two directions corresponding to these two local maxima of the radial slope intersect at the saddle point. They also each form a boundary between two connected components dividing the mesh. This holds for each projected mesh element comprising at least two local maxima of the radial slope.

In other words, for each identified saddle point, the identified ascending paths divide at least a part of the mesh into connected components which are each bounded by one of the followings:
a couple of ascending paths each ascending from the saddle point according to two direction angles forming a maximal angle in a same projected mesh element,
an ascending path belonging to such a couple of ascending paths and another ascending path belonging to another such couple of ascending paths, or
an ascending path belonging to such a couple of ascending paths and another ascending path ascending from the saddle point according to the direction angle corresponding to a unique radial slope local maxima of a projected mesh element.

The identified ascending paths all intersect at the saddle point. Each connected component comprises no other identified ascending path than the ones bounding the connected component. All the paths identified for all identified saddle points fully divide the mesh into such connected components.

In examples, the retrieving of the couple forming the maximal angle comprises retrieving a first local maxima of the radial slope and a last maxima of the radial slope according to a trigonometric order or to an anti-trigonometric order in the projection of the mesh element. This improves simplicity, efficiency and robustness of the watershed segmentation method, as it ensures to retrieve the couple by simply moving angularly about the projection of the saddle point in the projection of the mesh element to retrieve the first and last local maxima of the radial slope. These retrieved first and last local maxima form the retrieved couple.

It is to be understood that the identifying of the paths is carried out for each identified saddle point. The mesh is fully divided into connected components by all these identified ascending paths. Then, the watershed segmentation method further comprises, for each identified saddle point, merging each connected component of which bottom point is the saddle point with a connected component comprising the identified path descending from the saddle point according to a direction of a steepest slope around the saddle point. The merging yields at least a part of a basin.

Merging connected components means connecting the connected components, so as to form one connected component of the mesh. For each identified saddle point, the connected components which are merged thus form a connected component of the mesh which represents at least a part of a basin. The identified ascending paths are such that this formed connected component is bounded by ascending paths each ascending from the saddle point according to local maximal slope directions around the saddle point. These ascending paths are such that any drop of water on the at least a part of the basin represented by this connected component necessarily flows towards the outlet of the basin.

The merging is a carried out for all identified saddle points, e.g. iteratively. For each identified saddle point, the corresponding merging results in connected components of the mesh which forms at least a part of a basin. It is to be understood that the at least a part of the basin may consist in the basin. Alternatively, it may consist in a strict part of the basin, the basin or at least other parts of it being yielded by merging connected components bounded by other ascending paths identified for other identified saddle points. In other words, as the merging is carried out for all identified saddle points, the watershed segmentation eventually yields, as a result of all these merges, connected components of the mesh each representing a full basin. These full basins form a watershed segmentation of the terrain.

Examples of the merging are now further discussed. In these examples, by "merging", it is understood not the merging carried out for a given identified saddle point, but the combination of all mergings carried out for all identified saddle points, as previously discussed.

In these examples, the merging comprises determining a graph having nodes each representing a connected component and arcs each representing a connection between two connected components. In these examples, the merging further comprises extracting the connected components of the graph. Each connected component of the graph represents a basin of the terrain. This is a robust and efficient manner of merging connected components so as to yield the basins of the watershed segmentation.

Each node of the graph represents a connected component among the connected components which divide the mesh. Determining the graph may comprise assigning the node to the connected component. The identified ascending paths are such that the bottom point of the connected component is either a saddle point or a local minimum of the altitude, and this for each connected component. Determining the graph may further comprise creating arcs each connecting two nodes representing two connected components and each representing a connection between the two connected components. Creating arcs may comprise, for each node representing a connected component having a saddle point as a bottom point, creating an arc between this node and the node representing to a connected component of the mesh that is located below the saddle point and that comprises the identified path descending from the saddle point according to a direction of a steepest slope around the saddle point. Thus, in examples, each node representing a connected component having a saddle point as a bottom point is connected by an arc in the graph to a node representing a connected component of the mesh that is located below the saddle point and that comprises the identified path descending from the saddle point according to the direction of the steepest slope around the saddle point. The connected component of the mesh that is located below the saddle point and that comprises the identified path descending from the saddle point according to the direction of the steepest slope around the saddle point is unique.

In examples, the computing of the watershed segmentation according to the watershed segmentation method is carried out by executing an algorithm which is now discussed. The algorithm of these examples is described by the following pseudo-code:

---

BEGIN ALGORITHM (Compute the watershed segmentation of the terrain based on the mesh, the watershed segmentation being given by the boundary of the basins):
- o determine all the saddle points according to the "Determine if a vertex V is a saddle point" algorithm;
- o determine the local maxima $\theta_i$ of the slope around each saddle point V. For that, consider the slope around V as a function (called the radial slope) depending $\theta$ which represents any direction angle between [0, 2 $\pi$] around V in the Oxy plane;
- o For any saddle point V, compute the global minimum of the radial slope function (which is an angle): this direction gives rise the valley of steepest descent denoted val;
- o For each connected component Cc of the upper star of V, apply the following process:
   - o If there is only one local maximum $\theta_i$ inside Cc, compute an ascending path from V which starting direction is given by $\theta_i$, according to the "Compute Ascending path from a point P" algorithm;
   - o Else, retrieve the first and the last local maximum $\theta_f$ et $\theta_l$ of the radial slope, which are the first and the last maximal slope using trigonometric order (counterclockwise) around V, restricted to the Cc component. Then, compute the ascending paths from V with starting directions $\theta_f$ and $\theta_l$;
   - o All these paths divide the terrain into connected components, which form the nodes of a graph G. The bottom point of each node is either;
      - ■ A degenerate saddle point
      - ■ A local minimum;
   - o In the first case, create an arc between this node and the node corresponding to the unique valley val of the degenerate saddle point.
   - o The resulting basins are given by the connected component of the graph G.

---

According to the above algorithm, all the water reaching the vertex V (from the connected components of the upper star) will then flow through the valley vat and remain in the same basin.

FIGS. 15 and 16 illustrate the above algorithm. FIG. 15 shows a degenerate saddle point (which corresponds to the center of the circle), with its valley vat of steepest descent, the three connected components 150, 152 and 154 of its upper star, and for each of them the first and last direction angles $\theta_f$ and $\theta_t$. FIG. 16 shows the result of the merging around the saddle point (one different shade of grey per each basin 160, 162, 164).

The above algorithm is efficient, notably because there is no need to browse all the mesh vertices, but only the saddle points. Thereby, the complexity of the computation depends on the number of saddle points and not on the mesh vertices. Subdividing the mesh triangles as does the above algorithm has little incidence on the computation time. In particular, doubling the number of triangles for the same geometry will not double the computation time. The above algorithm is also accurate, because the basin boundaries are not constrained by terrain edges and follow the steepest ascending direction.

In examples where the mesh is a triangular mesh, triangles that are crossed by ascending watershed lines are split during the computing of the watershed segmentation, the resulting fragments being associated to basins yielded as output. Thus, in these examples, the watershed segmentation method is not bounded to follow the mesh edges when identifying paths, which makes the watershed segmentation method robust and ensures relatively accurate results.

In any case, the computed watershed segmentation is accurate in that it is consistent with water trajectory: the watershed segmentation method guaranties indeed that any trajectory of any drop lying inside a given basin ends up at the outlet of the basin. Also, the watershed segmentation method does not require any modification of the input terrain (i.e. the provided mesh), e.g. by adding and/or removing vertex and/or by altering vertex coordinates. In particular, the watershed segmentation does not require any splitting of degenerate saddle point into regular saddle points, which makes the watershed segmentation method particularly robust.

The watershed segmentation method may further comprise displaying, on a computer display, the computed watershed segmentation. Displaying the computed watershed segmentation allows to perform, as previously discussed, a civil engineering analysis and/or one or more physical actions based on the displayed computed watershed segmentation.

The regularization method is now further discussed.

The regularization method comprises providing a watershed segmentation of a terrain. The watershed segmentation comprises basins. The concept of watershed segmentation has been previously discussed and is not further discussed.

The providing of the watershed segmentation may comprise computing the watershed segmentation, by any known method. For example, the providing of the watershed segmentation may comprise computing the watershed segmentation according to the watershed segmentation method as previously discussed.

Alternatively, the providing of the watershed segmentation may comprise retrieving the watershed segmentation from a (e.g. distant) memory where it has been stored after its computing (e.g. according to the watershed segmentation method).

The regularization method further comprises merging first basins of the watershed segmentation that each verify a smallness criterion, each with a second basin downstream to the first basin. This means that the regularization method explores (e.g. all) the basins of the watershed segmentation and merges each explored first basin verifying a smallness criterion with a second basin downstream to the first basin. The second basin is the downstream basin of the first basin that is the basin adjacent to the first basin through the spillway of the first basin. This allows merging of small basins (i.e. with respect to the smallness criterion) each with downstream second basins, which ultimately results in that the watershed segmentation being regularized: the watershed segmentation, after the merging, comprises only or relatively only large basins, i.e. each violating the smallness criterion. It is to be understood that second basins and/or merged basins may also be first basins verifying the smallness criterion, in which case they are also merged with their downstream basins. Therefore, each basin of the regularized watershed segmentation is the result of the merging of two or more basins of the provided watershed segmentation.

A basin satisfying the smallness criterion is a basin that is relatively small. In examples, this means that the basin is so small that it is not relevant to the civil engineer, e.g. when performing a civil engineering analysis. Additionally or alternatively it may mean that the basin corresponds to a numerical artefact and/or a noise within the watershed segmentation but does not exist in the real world.

In examples, a basin verifies the smallness criterion if a quantification of a smallness of the basin is lower than a predefined threshold. The predefined threshold may be a threshold value defined by a user (e.g. a civil engineer) beforehand, that is before performing the regularization method. This allows merging of first basins of the segmentation that are too small to exist in the real world and/or that are too small to be relevant to the civil engineer. The quantification of the smallness may be any value representing the smallness of the basin. In examples, the quantification of the smallness of the basin comprises one or more of a quantification of a depth of the basin, a quantification of an area of the basin and/or a quantification of a volume of the basin. If the quantification of the smallness of the basin is a quantification of the depth of the basin, the threshold's order of magnitude may be the meter (e.g. for a model of the whole terrain) or the decimeter (e.g. for an urban model). If the quantification of the smallness of the basin is a quantification of the area of the basin, the threshold's order of magnitude may be the square meter. If the quantification of the smallness of the basin is a quantification of the volume of the basin, the threshold's order of magnitude may be the cubic meter (e.g. in the context of dyke study) or much less (e.g. in the context of drainage study, as the civil engineer will later be interested in the speed with which a basin fills itself). The quantification of a depth of the basin may be a depth value of the basin that is a value of the depth of the basin. The quantification of an area of the basin may be an area value of the basin that is a value of the area of the basin. The quantification of a volume of the basin may be a volume value of the basin that is a value of the volume of the basin.

The merging is now further discussed.

The merging may be carried out iteratively, that is the merging may comprise iteratively exploring basins of the watershed segmentation. The merging may iteratively identify explored basins which are first basins verifying the smallness criterion. Each identified first basin is merged with (e.g. connected to) a second basin which is the basin downstream to the first basin. It is to be understood that the second basin may also be a first basin verifying the smallness criterion, in which case the second basin is also merged with its downstream second basin during the merging.

In examples, the merging comprises determining an oriented graph having nodes and arcs. Each node represents a basin. Each arc represents a connection between a first basin that verifies the smallness criterion and a second basin downstream to the first basin. The arc is oriented from a first node representing the first basin to a second node representing the second basin. In these examples, the merging further comprises merging the basins corresponding to nodes of a same connected component of the oriented graph. The graph may be a directed acyclic graph (referred to as "DAG" hereinafter).

Determining the oriented graph and carrying out the merging of first basins with second basins by merging the basins corresponding to nodes of a same connected component in the graph is an efficient and robust manner of carrying out the merging, and thus of regularizing the provided watershed segmentation. Notably, the graph forms a data structure which captures well the arrangement of the small basins relative to one another in terms of which basin is upstream or downstream of another basin. Indeed, the nodes of a connected component of the graph represent a group of basins which:

are two by two downstream to each other; and
 are each downstream to a respective first basin of the group verifying the smallness criterion, except for the basin of the group which is the most upstream.

This amounts to say that the basins form a DAG indicating the order in which the basins will poor into each other.

Thereby, merging the basins corresponding to nodes of a same connected component of the graph yields efficiently a basin of the regularized watershed segmentation, that is which violates the smallness criterion.

In examples, the determining of the oriented graph comprises exploring the basins according to a smallness order that rewards basin smallness. In these examples, the determining of the oriented graph further comprise, for each explored first basin verifying the smallness criterion, creating an arc between the node representing the first basin and the node representing a second basin downstream to the first basin. The arc is oriented from the node representing the first basin to the node representing the second basin. Prior to the creating of the arcs, the determining may comprise, for each explored basin, creating a node in the graph representing the basin. In any case, the graph resulting from the creating of the arcs is a DAG.

The smallness order is an order that rewards basin smallness. In other words, a basin comes before another basin in the smallness order if the basin is smaller than another basin. Exploring the basins according to the smallness order thus consists in exploring first the smallest basin of the provided watershed segmentation, exploring then the smallest basin among non-explored basins of the provided watershed segmentation, exploring then the smallest basin among non-explored basins of the provided watershed segmentation, and so on, until all basins of the provided watershed segmentation are explored. Exploring the basins may comprise, for each basin, computing the previously-discussed quantification of the smallness of the basin, for example by computing the depth of the basin, the area of the basin or the volume of the basin. Exploring the basins may further comprise sorting the basins according to increasing quantification of the smallness, e.g. by sorting the basins according to increasing depth (the smallness order being then a depth order), according to increasing area (the smallness order being then an area order) or according to increasing volume (the smallness order being then a volume order). Exploring the basin may then comprise exploring (e.g. visiting) the sorted basins along the smallness order.

Exploring the basins according to the smallness order is an efficient and robust manner of ensuring that connected components of the graph each represent a group of basins which are two by two downstream to each other, and which are each downstream to a respective first basin of the group verifying the smallness criterion, except for the basin of the group which is the most upstream. Merging basins of each respective one of these groups thus efficiently yield a respective basin of the regularized watershed segmentation.

In examples, the watershed segmentation comprises, for each basin, data representing water trajectory within the basin. In these examples, the merging comprises, for each first basin that is merged with a second basin, computing data representing a water trajectory between the first basin and the second basin. Thereby, besides regularizing the provided watershed segmentation, the regularization method also yields water trajectory within each basin of the regularized watershed segmentation. The regularized watershed segmentation outputted by the regularization method thus allows the understanding of the water trajectory and/or the visualizing of the impact of any earthworks on the water dynamic, which is very relevant for civil engineering. Said otherwise, the regularization method may regularize the provided watershed segmentation and update water trajectory accordingly and simultaneously.

The data representing trajectory within the basin may be any data representing the trajectory of any flow of water within the basin, such as one or more paths within the basin. In examples, the one or more paths comprise a path from the outlet of the basin to the spillway of the basin, also referred to as "extending ascending path", and/or a path from the spillway of the upstream basin of the basin to the outlet of the basin, also referred to as "extending descending path". The data representing a water trajectory between the first basin and the second basin may be any data representing the trajectory of any flow of water flowing from the first basin into the second basin and may be computed based on data representing water trajectory within the first and second basins.

The computing of the data representing the water trajectory between the first basin and the second basin may be based on (e.g. may take as input) on first data representing water trajectory within the first basin and second data representing water trajectory within the second basin. This improves accuracy of the computed water trajectory between the first basin and the second basin. In examples, the first data comprise the extending ascending path from an outlet of the first basin to a spillway of the first basin, and/or the second data comprise the extending descending path from a spillway of the first basin to an outlet of the second basin.

In examples, the first data comprise the extending ascending path from an outlet of the first basin to a spillway of the first basin and the second data comprise the extending descending path from a spillway of the first basin to an outlet of the second basin. In these examples, the computing of the data representing the water trajectory between the first basin and the second basin may take as input said extending ascending and extending descending paths and output a path, which may be referred to as "extended path", which corresponds to the concatenation of said extending ascending and extending descending paths. In other words, the extended path connects the outlet of the first basin to the spillway of the first basin according to the extending ascending path, and then connects the spillway of the first basin to the outlet of the second basin according to the extending descending path. As this is done for each merging of a first basin with a downstream second basin, this ensures that any water path reaching a former outlet (i.e. an outlet of the provided watershed segmentation) be able to be extended until it reaches an outlet of a filtered basin (i.e. a basin of the regularized watershed segmentation). Such a trajectory of a drop toward an outlet of the filtered (i.e. regularized) watershed segmentation forms an extended path. Extended paths constitute objective physical information particularly relevant for civil engineering.

The regularization method may further comprise displaying, on a computer display, the regularized watershed segmentation. Displaying the regularized watershed segmentation allows to perform, as previously discussed, a civil engineering analysis and/or one or more physical actions based on the displayed regularized watershed segmentation.

An example of the regularization method is now discussed.

In this example, the provided watershed segmentation contains many shallow basins that harm the readability of the result. This is illustrated on FIG. 17, showing a screenshot of the provided watershed segmentation as displayed on a computer display. It may difficult for the user (e.g. the civil engineer) to understand the water trajectory and visualize the impact of any earthworks on the water dynamic based on this displayed provided watershed segmentation.

In this example, the merging comprises the exploring of the basins according to the smallness order, as previously discussed. The exploring comprises sorting the original basins (i.e. the basins of the provided watershed segmentation) following an increasing depth (resp. area, resp. volume) ordering. The exploring further comprises creating a Directed Acyclic Graph (DAG) whose nodes are the initial basins.

Then, following increasing depth (resp. area, resp. volume) ordering, for each basin B, the exploring comprises creating an oriented arc in the graph joining B toward its downstream basin B'. Simultaneously, the exploring comprises associating to this arc two paths called extending paths $P_{Ascending}$ and $P_{Descending}$: $P_{Ascending}$ from the outlet $O_B$ of B to the spillway of B, and $P_{Descending}$ from the spillway of B to the outlet of B', denoted $O_{B'}$. FIG. 19 illustrates these paths.

Then, the set of basins in each connected component of the graph are merged into so-called filtered basins, forming the regularized (i.e. filtered) watershed segmentation. The remaining (i.e. filtered) basins have a depth greater than the given threshold. FIG. 20 shows the remaining basin after the merging of the basins B and B' of FIG. 19.

Figure 22:
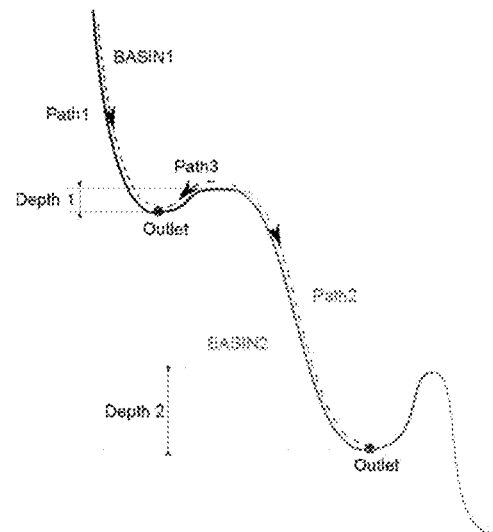
Figure 23:
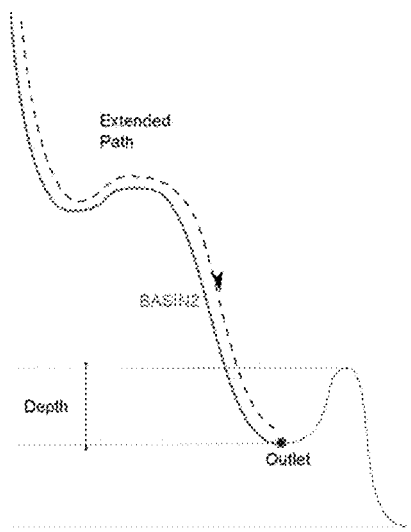

In this example, the merging is carried out by executing the algorithm described by the following pseudo-code:

the merging according to the above algorithm. FIG. 22 shows two basins of the provided watershed segmentation. Note that basin 1 has a small depth and satisfies the smallness criterion. FIG. 23 shows the effect of the merging: only one basin remains after the merging.

Figure 24:
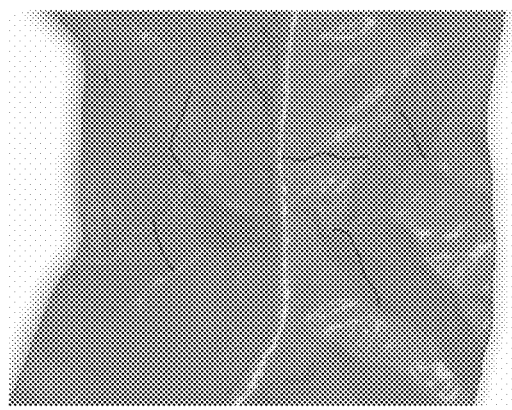
Figure 25:
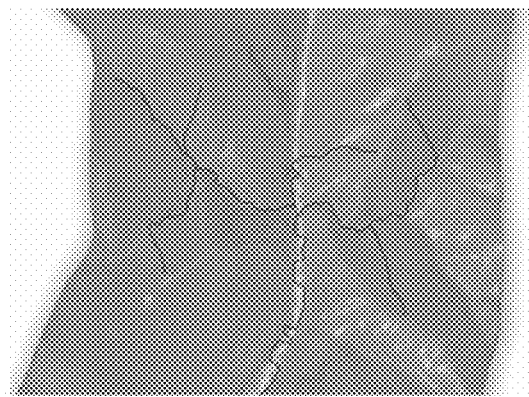

In this example, the water trajectory and the watershed segmentation remain consistent after the merging. Whatever the depth threshold eps given by the user (and even if eps=0), any path remains included in the basin that contains the starting point and will reach the outlet of this basin (or the edge of the ground). Thus, when eps>0, the merged basins still form a new segmentation of the terrain that verifies the previous property. This is illustrated on FIG. 24, showing original water trajectories (which stop when reaching an outlet), and on FIG. 25, showing the computed extended path using eps=1 m.

The contributor computation method is now further discussed.

The contributor computation method comprises providing a mesh representing a terrain. The providing of the mesh representing the terrain has been previously discussed and is not further discussed. The contributor computation method further comprises providing a polyline on the mesh.

The polyline is a line formed by vertices of the mesh and edges of the mesh each connecting two of said vertices. Providing the polyline may comprise defining the polyline on the mesh, e.g. by graphical user interaction. For example, the mesh may be displayed on a computer display and a user may define the line by interacting graphically with the display, e.g. using a touch or a haptic device. The user may for example draw the line or select the vertices and/or the edges of the line. Alternatively, the polyline may already be defined on the mesh when the mesh is provided. In such a case, the polyline is provided with the mesh. The polyline may represent a construction on the terrain, which may be a construction terrain. For example, the polyline may represent a road, a railroad, a channel, a building or a mine.

The contributor computation method further comprises computing a contributor of the polyline. As previously explained, the contributor is the set of points of the mesh from which water will necessarily flow towards a point of the polyline. The polyline may be connected and/or open or close. The contributor is computed in any case, which makes the contributor computation method robust.

---

BEGIN ALGORITHM
- Create an empty DAG;
- For each initial basin, create a corresponding vertex in DAG;
- Sort the basins according to increasing depth;
- Along this order, while there is a basin B which depth (resp. area, resp. volume) is lower than a predefined threshold specified by a user:
  - Let c be the spillway of B. c lies on a polyline shared by B and its downstream basin B'. Add an arc from B to B' in the DAG;
  - Let o be the outlet of B and o' the one of B'. Compute the two extending paths $P_{Ascending}$ and $P_{Decending}$;
- Create a new empty watershed segmentation that will store the filtered basins:
  - For each connected component in the DAG, create a new basin as the union of all the initial basins in the connected component.

END ALGORITHM

---

FIG. 18 shows the result of the merging of the segmentation of FIG. 17 according to the above algorithm, where the depth threshold equals 0.5 mm. FIG. 21 shows the computed water trajectory between the first basin B and the second basin B' of FIG. 19. FIGS. 22 and 23 further illustrate The computing of the contributor comprises modifying the mesh by determining, based on the polyline, a trench below the polyline. In other words, the modifying yields a modified mesh which is identical to the provided mesh except for the polyline which is replaced by a trench below the polyline. In examples, the modifying of the mesh comprises transforming (e.g. deforming, mapping) the polyline into the trench, e.g. by continuously bending the polyline. For example, continuously bending the polyline may comprise lowering the altitude coordinates of the points of the polyline in such a way that there is only one altitude local minimum along the trench and that the points of the trench are all lower than the original mesh vertices. For example, if the polyline has 2N points, the altitude coordinate on the trench decreases from point 0 to point N−1, and then increases from point N to point 2N−1. The trench is a part of the mesh which has substantially the shape of a trench, such as a U-shape or a V-shape below the polyline.

In examples, each point of the polyline corresponds to a point of the trench. In other words, the modifying consists in mapping of the polyline onto the trench. For example, the mapping may consists in mapping each vertex of the polyline, said vertex belonging to the provided mesh, onto a corresponding vertex of the trench, said vertex belonging to the modified mesh. In these examples, each point of the trench has an altitude lower than the corresponding point on the polyline. In other words, the mapping lowers the altitudes of the points (e.g. the vertices) of the polyline so as to transform it into the trench. This is a simple, robust and efficient manner of determining the trench.

An example of the modifying of the mesh is now discussed. In this example, the modifying consists in applying a mapping to the vertices of the polyline, the mapping lowering the altitudes of these vertices so as to transform them into vertices of the trench, thereby transforming the polyline into the trench. In this example, the modifying is carried out by executing the following algorithm, which may be referred to as the "modify the altitude of the points of the polyline" algorithm, and which is described by the following pseudo-code:

Begin Algorithm (Modify the Altitude of the Points on the Polyline)

Let $z_{min}$ the lowest z-coordinate on all the mesh vertices
Let N be the number of vertices of the polyline,
From i=1 to N/2
Change the z-coordinate of the i-th vertex along the polyline by $z_{min}$ $$-1 - \frac{i}{2N}$$

From $i = (N/2) + 1$ to $N$

Change the z-coordinate of the i-th vertex along the polyline by $z_{min}$ $$-1 - \frac{N-i}{2N}$$

End Algorithm

In examples, only one of the points of the trench is an altitude local minimum. In other words, the modifying of the mesh results in that only one point (e.g. only one vertex) of the trench has a minimal altitude among all points (e.g. vertices) of the trench. This eventually improves robustness of the computing of the watershed segmentation and of the identifying of the basin comprising the mesh, which are now discussed.

The computing of the contributor of the polyline further comprises computing a watershed segmentation of the terrain based on the modified mesh. In other words, the computing of the watershed segmentation takes as input the modified mesh and outputs a watershed segmentation of the terrain from the input modified mesh. The computing of the watershed segmentation may be carried out according to any method for computing watershed segmentation based on a mesh. In examples, the computing of the watershed segmentation comprises applying the watershed segmentation method, as previously discussed. In such a case, the computing of the watershed segmentation benefits from the previously discussed improvements of accuracy, efficiency and robustness provided by the watershed segmentation method.

In examples, the computing of the watershed segmentation comprises computing, e.g. by applying the watershed segmentation method, an initial watershed segmentation of the terrain based on the modified mesh. In these examples, the computing of the watershed segmentation further comprises performing, e.g. by applying the regularization method, a regularization of the computed initial watershed segmentation. This allows the identifying of the basin to be performed on a regularized (i.e. filtered) watershed segmentation, initially computed based on the modified mesh. This indeed removes from the initial watershed segmentation basins which are so small, e.g. which have a so small depth, area and/or volume value, that they correspond to a numerical artefact and/or to a noise of the computing of the initial watershed segmentation and/or that they are not relevant from the civil engineering point of view. Eventually, the identifying of a basin comprising the trench is improved, as it is ensured that the identified basin will not correspond to a basin so small that it should be discarded and not identified, for the reasons explained above. Moreover, the regularization yields in examples an identified basin which is larger than the one identified without the regularization. Thereby, these examples yield a computed contributor which is larger and/or more relevant to the civil engineer. This contributor may be referred to as the "extended" contributor.

In any case, the computing of the watershed segmentation results in that the modified mesh is segmented into parts each representing a basin of the computed watershed segmentation. The trench, because of its shape (e.g. because the trench comprises only one altitude local minimum), is included into one basin having as outlet a point of the mesh. The computing of the contributor further comprises, based on the computed watershed segmentation, identifying, on the modified mesh, a basin comprising the trench. In other words, the identifying searches among basins of the computed watershed segmentation the one basin into which the trench is included and having as outlet the point of the mesh and identifies this basin. In yet other words, the identified basin comprising the trench is the one basin into which the trench is included and having as outlet the point of the mesh. In examples, only one of the points of the trench is an altitude local minimum and the identified basin has as outlet this altitude local minimum.

The identified basin corresponds to the contributor. This means that the identified basin, belonging to the modified mesh, corresponds to the part of the provided mesh which represents the contributor. Specifically, the identified basin consists in (e.g. is the union of) the trench and another part of the modified mesh. Said another part is identical in the modified mesh and in the provided mesh. The contributor then consists in (e.g. is the union of) the polyline and said another part. In examples, the computing of the contributor further comprises modifying the basin by transforming back the trench into the polyline. The modified basin resulting from this modifying is the contributor, as the trench is transformed back into the polyline. In other words, the modified basin is made of the polyline and of said another part, and thereby is the contributor. Transforming back the trench into the polyline means inverting the modifying of the mesh which resulted in determining the trench based on the polyline. For example, if the polyline has been mapped onto the trench by the modifying as previously discussed, transforming back means applying the inverse mapping to the trench to map it back onto the polyline.

An example of the computing of the contributor is now discussed. In this example, the mesh is a 3D triangular mesh. In the examples, the computing of the contributor is carried out by executing the following algorithm, described by the following pseudo-code:

```
BEGIN ALGORITHM
- To compute the contributor of the polyline denoted P, duplicate the initial
  terrain (i.e. the provided mesh) and insert the points – denoted S_i – of P into
  the copy of terrain (i.e. the modified mesh) (denoted M'), by subdividing the
  triangles containing the points S_i. Note that the copy of the terrain mesh is
  hidden from the user and is of internal purpose only.
- Then, modify the z-coordinate of the inserted points, by applying the
  "modify the altitude of the points on the polyline" algorithm to fill the
  following properties:
       o  Every point S_i has an altitude lower than any point of the original
          terrain.
       o  Only one of the points S_i is a local minimum of the altitude function
          (this local minimum will be turned into an outlet of a basin):
  The polyline which vertices have been modified to fill the previous properties
  is the trench.
- Then, compute the watershed segmentation on this modified terrain. The
  contributor of the polyline is given by the basin which outlet is located on
  the trench (i.e. which outlet is one of the points S_i).
- Extract the mesh of this basin, and then restore the z-coordinates of the
  points lying on the trench, which induces that the resulting mesh is a subset
  of the initial terrain. This resulting mesh is precisely the contributor, and any
  path starting from a point contained in the result will cross the target
  polyline.
END ALGORITHM
```

FIGS. 26 to 36 illustrate the above algorithm and are now discussed.

Figure 26:
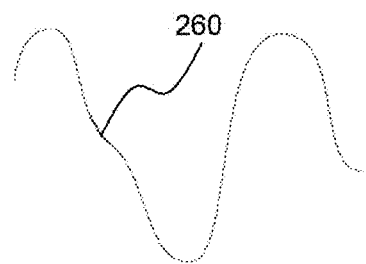
Figure 27:
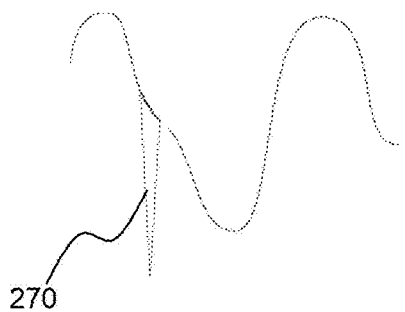
Figure 28:
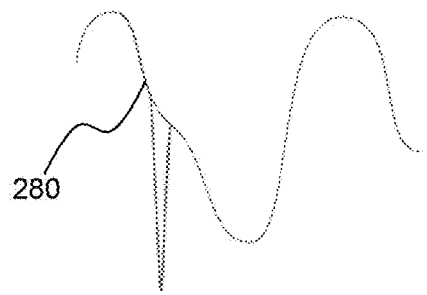
Figure 29:
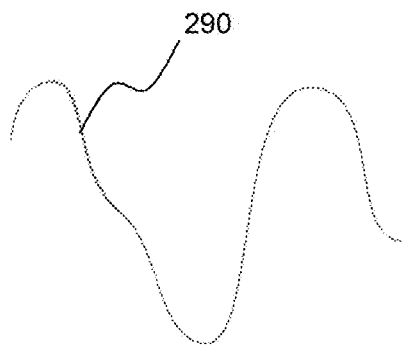

FIG. 26 shows the terrain and a polyline 260 on the terrain. FIG. 27 shows the determined trench 270. FIG. 28 shows the identified basin 280 of the watershed segmentation computed on the modified mesh. FIG. 29 shows the computed contributor 290 of the polyline, retrieved by restoring the coordinates.

Figure 30:
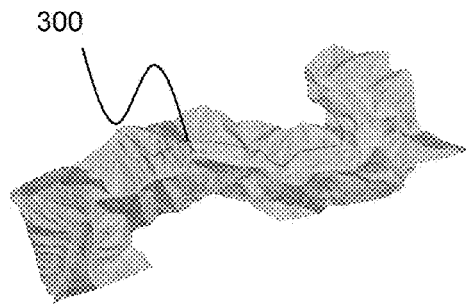
Figure 31:
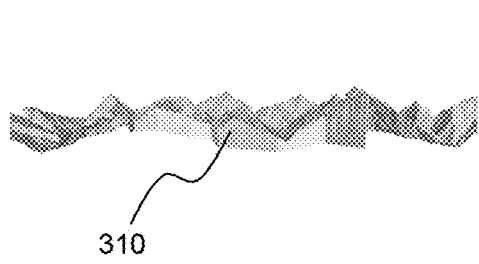
Figure 32:
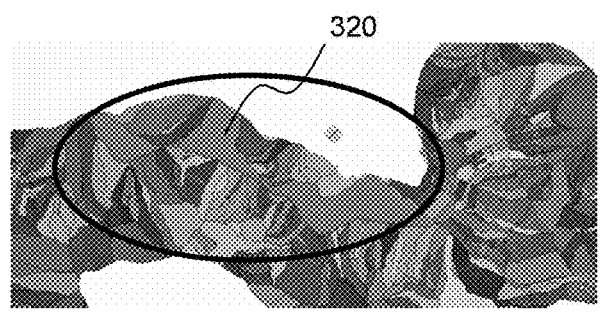
Figure 33:
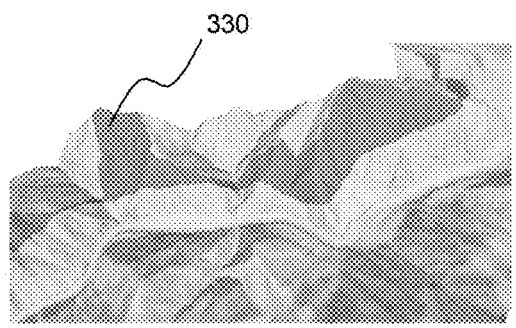

FIG. 30 shows a terrain and a polyline 300 representing an alignment on the terrain. FIG. 31 shows a sectional view of the trench 310 on the modified mesh of the terrain. FIG. 32 shows the identified basin 320 (circled in FIG. 32) on the computed watershed segmentation of the modified mesh. This identified basin's outlet is located on the trench 310 of FIG. 31. FIG. 33 shows the computed contributor 330 of the polyline 300 of FIG. 30.

Figure 34:
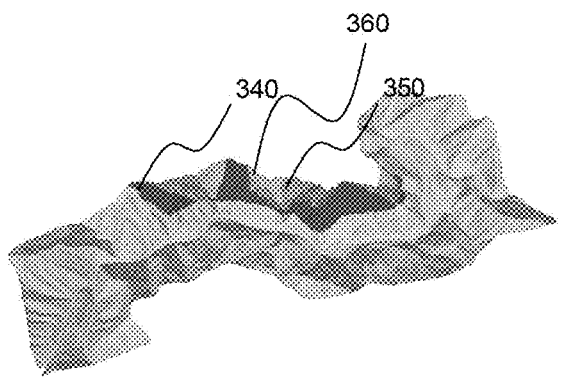
Figure 35:
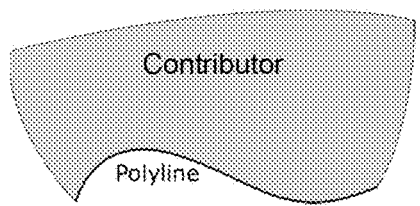

As previously discussed, the computing of the watershed segmentation may comprise computing initial watershed segmentation according to the watershed segmentation method and performing a regularization of the initial watershed segmentation by applying the regularization method. The resulting computed segmentation still contains a basin which outlet lies on the trench, and this basin gives rise to the extended contributor—the contributor on which topological filtering has been applied—, which is the result of the topological filtering (i.e. the regularization). It means that any extended path starting from a point contained in the extended contributor will cross the input polyline. FIG. 34 shows the extended contributor, computed in such a way, of the polyline 300 of FIG. 30. FIG. 34 shows the extended contributor for several values of depth threshold used when performing the regularization method: 0.5 m (340, red), 1 m (350, dark pink) and 2 m (360, pale pink).

Figure 36:
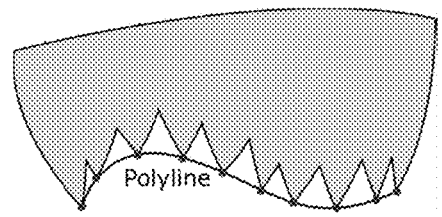

The above algorithm is particularly efficient and accurate. Notably, it computes the contributor of the polyline using a single operation as previously discussed and is not affected by the complexity of the polyline (in examples, only the number of critical points matters). The above algorithm is in particular much more robust and efficient than methods which sample the polyline into points, compute the contributor of each point, and then compute the union of all these contributors. The result of the Boolean union of all the contributors of the sample points is indeed not equal to the contributor of the polyline. Indeed, it is possible to find a point out of the Boolean union that flow toward the polyline. This is illustrated on FIGS. 35 and 36. FIG. 36 shows a contributor of a polyline computed by the above algorithm. FIG. 36 shows the union of the contributors of the sample points on the polyline.

The contributor computation method may further comprise displaying, on a computer display, the contributor of the polyline. Displaying the contributor allows to perform, as previously discussed, a civil engineering analysis and/or one or more physical actions based on the displayed contributor.

The watershed segmentation method, the regularization method and the contributor computation method are computer-implemented methods.

This means that steps (or substantially all the steps) of the methods are executed by at least one computer, or any system alike. Thus, steps of the methods are performed by the computer, possibly fully automatically, or, semi-automatically. In examples, the triggering of at least some of the steps of the methods may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the methods with a system adapted for this purpose. The system may comprise a processor coupled to a memory and a graphical user interface (GUI), the memory having recorded thereon a computer program comprising instructions for performing the methods. The memory may also store a database. The memory is any hardware adapted for such storage, possibly comprising several physical distinct parts (e.g. one for the program, and possibly one for the database).

Figure 37:
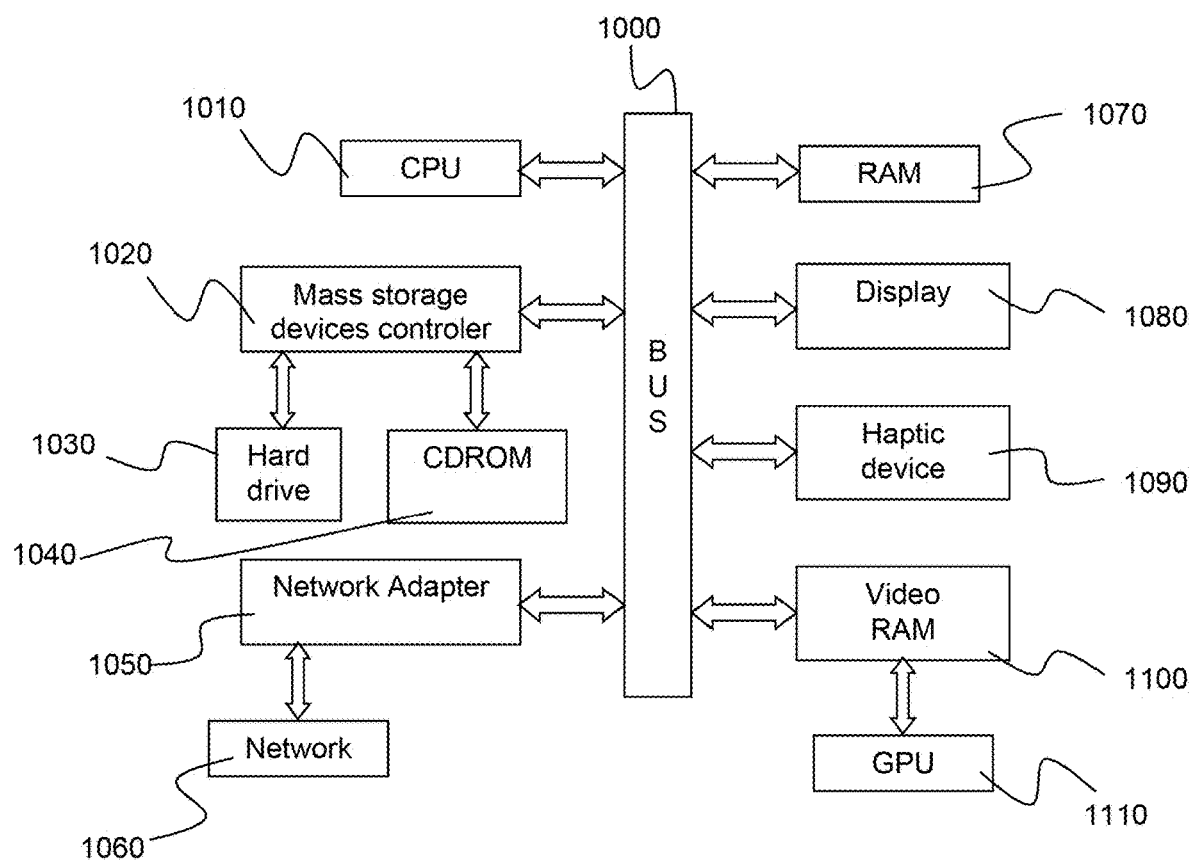
FIG. 37 shows an example of the system.

FIG. 37 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

Any computer program herein may comprise instructions executable by a computer, the instructions comprising means for causing the above system to perform one or more of the watershed segmentation method, the regularization method and/or the contributor computation method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the methods by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing one or more of the watershed segmentation method, the regularization method and/or the contributor computation method.

The invention claimed is:

1. A computer-implemented method for civil engineering, the method comprising:
obtaining a mesh representing a terrain and a polyline on the mesh; and
computing a contributor of the polyline, the contributor being a set of mesh points that represents points of the terrain from which water necessarily flows toward a terrain point represented by a point of the polyline, the computing of the contributor including:
modifying the mesh by determining, based on the polyline, a trench below the polyline,
computing a watershed segmentation of the terrain based on the modified mesh, and
based on the computed watershed segmentation, identifying, on the modified mesh, a basin including the trench, the contributor corresponding to the identified basin.

2. The method of claim 1, wherein each point of the polyline corresponds to a point of the trench, and each point of the trench has an altitude lower than the corresponding point on the polyline.

3. The method of claim 2, wherein only one of the points of the trench is an altitude local minimum.

4. The method of claim 3, wherein the identified basin has an outlet which is the altitude local minimum.

5. The method of claim 1, wherein the computing of the contributor further comprises:
modifying the basin by transforming back the trench into the polyline, the modified basin being the contributor.

6. The method of claim 1, wherein the computing of the watershed segmentation further comprises:
computing an initial watershed segmentation of the terrain based on the modified mesh; and
performing a regularization of the computed initial watershed segmentation.

7. The method of claim 1, wherein the terrain is a construction terrain.

8. The method of claim 1, wherein the polyline represents a construction on the terrain.

9. The method of claim 8, wherein the polyline represents a road, a railroad, a channel, a building or a mine.

10. A device comprising
a processor; and
a non-transitory data storage medium having recorded thereon a computer program comprising instructions that when executed by a processor causes the processor to be configured to:
obtain a mesh representing a terrain and a polyline on the mesh, and
compute a contributor of the polyline, the contributor being a set of mesh points that represents points of the terrain from which water necessarily flows toward a terrain point represented by a point of the polyline, by being configured to:
modify the mesh by determining, based on the polyline, a trench below the polyline,
compute a watershed segmentation of the terrain based on the modified mesh, and based on the computed watershed segmentation, identify, on the modified mesh, a basin including the trench, the contributor corresponding to the identified basin.

11. The device of claim 10, wherein each point of the polyline corresponds to a point of the trench, and each point of the trench has an altitude lower than the corresponding point on the polyline.

12. The device of claim 11, wherein only one of the points of the trench is an altitude local minimum.

13. The device of claim 12, wherein the identified basin has an outlet which is the altitude local minimum.

14. The device of claim 10, wherein the processor is further configured to compute of the contributor by being further configured to:
  modify the basin by transforming back the trench into the polyline, the modified basin being the contributor.

15. The device of claim 10, wherein the processor is further configured to compute the watershed segmentation by being further configured to:
  compute an initial watershed segmentation of the terrain based on the modified mesh, and
  perform a regularization of the computed initial watershed segmentation.

16. A non-transitory data storage medium having recorded thereon a computer program that when executed by a computer causes the computer to implement a method for civil engineering, the method comprising:
  obtaining mesh representing a terrain and a polyline on the mesh; and
  computing a contributor of the polyline, the contributor being a set of mesh points that represents points of the terrain from which water necessarily flows toward a terrain point represented by a point of the polyline, the computing of the contributor including:
  modifying the mesh by determining, based on the polyline, a trench below the polyline,
  computing a watershed segmentation of the terrain based on the modified mesh, and
  based on the computed watershed segmentation, identifying, on the modified mesh, a basin comprising the trench, the contributor corresponding to the identified basin.

* * * * *